United States Patent
Lee et al.

(10) Patent No.: US 11,509,298 B2
(45) Date of Patent: *Nov. 22, 2022

(54) COMPARATOR PROVIDING OFFSET CALIBRATION AND INTEGRATED CIRCUIT INCLUDING COMPARATOR

(71) Applicant: SAMSUNG ELECTRONICS CO., LTD., Suwon-si (KR)

(72) Inventors: Jaehoon Lee, Suwon-si (KR); Yong Lim, Seoul (KR); Wan Kim, Hwaseong-si (KR); Barosaim Sung, Daejeon (KR); Seunghyun Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/514,552

(22) Filed: Oct. 29, 2021

(65) Prior Publication Data
US 2022/0052679 A1     Feb. 17, 2022

Related U.S. Application Data

(63) Continuation of application No. 16/855,593, filed on Apr. 22, 2020, now Pat. No. 11,183,997.

(30) Foreign Application Priority Data

Aug. 26, 2019 (KR) .................. 10-2019-0104575

(51) Int. Cl.
*H03K 5/22* (2006.01)
*H03K 5/24* (2006.01)
*H03M 1/10* (2006.01)

(52) U.S. Cl.
CPC ............ *H03K 5/2481* (2013.01); *H03K 5/22* (2013.01); *H03K 5/249* (2013.01); *H03K 5/2472* (2013.01); *H03M 1/1023* (2013.01)

(58) Field of Classification Search
CPC .......... H03K 3/023; H03K 5/02; H03K 5/023; H03K 5/08; H03K 5/22; H03K 5/24;
(Continued)

(56) References Cited

U.S. PATENT DOCUMENTS 6,757,327 B1    6/2004  Fiedler
6,798,293 B2    9/2004  Casper et al.
(Continued)

FOREIGN PATENT DOCUMENTS

JP    2001-111421 A    4/2001

*Primary Examiner* — Long Nguyen
(74) *Attorney, Agent, or Firm* — Sughrue Mion, PLLC

(57) ABSTRACT

A comparator configured to calibrate an offset according to a control signal, including an input circuit configured to receive a first input signal and a second input signal, and to generate a first internal signal corresponding to the first input signal and a second internal signal corresponding to the second input signal; a differential amplification circuit configured to consume a supply current flowing from a positive voltage node having a positive supply voltage to a negative voltage node having a negative supply voltage, and to generate an output signal by amplifying a difference between the first internal signal and the second internal signal; and a current valve configured to adjust at least a portion of the supply current based on the control signal.

20 Claims, 23 Drawing Sheets

(58) Field of Classification Search
CPC .... H03K 5/2472; H03K 5/2481; H03K 5/249; H03F 3/45744; H03F 2203/45036; H03F 2203/45042; H03F 2203/45044; H03M 1/1023; G01R 19/0038
See application file for complete search history.

(56) References Cited

U.S. PATENT DOCUMENTS

| | | |
|---|---|---|
| 7,888,995 B2 | 2/2011 | Motoyui |
| 8,026,761 B2 | 9/2011 | Nolan et al. |
| 8,198,921 B2 | 6/2012 | Chen et al. |
| 8,339,296 B2 | 12/2012 | Danjo |
| 8,378,863 B2 | 2/2013 | Ishikawa |
| 8,836,376 B2 | 9/2014 | Danjo |
| 9,170,282 B2 | 10/2015 | Savanth et al. |
| 9,496,785 B2 | 11/2016 | Savanth et al. |
| 9,660,660 B1 | 5/2017 | Beukema et al. |
| 11,183,997 B2 * | 11/2021 | Lee ................. H03M 1/1023 |
| 2015/0349758 A1 * | 12/2015 | Chen .................. H03K 5/249 327/63 |

\* cited by examiner

COMPARATOR PROVIDING OFFSET CALIBRATION AND INTEGRATED CIRCUIT INCLUDING COMPARATOR

CROSS-REFERENCE TO THE RELATED APPLICATION

This application a continuation of U.S. patent application Ser. No. 16/855,593, filed on Apr. 22, 2020, issued as U.S. Pat. No. 11,183,997 on Nov. 23, 2021, which is based on and claims priority under 35 U.S.C. § 119 to Korean Patent Application No. 10-2019-0104575, filed on Aug. 26, 2019, in the Korean Intellectual Property Office, the disclosure of which are incorporated by reference herein in their entirety.

BACKGROUND

1. Field

The present disclosure relates to a comparator and, more specifically, to a comparator providing offset calibration and an integrated circuit including the same.

2. Description of Related Art

A comparator which generates an output signal indicating a comparison result by comparing input signals may be used for various applications. For example, an analog-to-digital converter (ADC) for converting an analog signal into a digital signal may include a plurality of comparators and generate a digital signal by encoding output signals of the plurality of comparators. In addition, a switching regulator may include a comparator for comparing a feedback signal to a reference signal.

The performance and efficiency of the applications may depend on characteristics of a comparator, for example power consumption, operating speed, noise properties, area, accuracy, and the like, and some of the characteristics of the comparator may be in a trade-off relationship. Accordingly, it may not be easy to implement a comparator having good characteristics without sacrificing other characteristics.

SUMMARY

According to embodiments, a comparator configured to calibrate an offset according to a control signal includes an input circuit configured to receive a first input signal and a second input signal, and to generate a first internal signal corresponding to the first input signal and a second internal signal corresponding to the second input signal; a differential amplification circuit configured to consume a supply current flowing from a positive voltage node having a positive supply voltage to a negative voltage node having a negative supply voltage, and to generate an output signal by amplifying a difference between the first internal signal and the second internal signal; and a current valve configured to adjust at least a portion of the supply current based on the control signal.

According to embodiments, a comparator configured to calibrate an offset according to a control signal includes an input circuit configured to receive a first input signal and a second input signal, and to generate a first internal signal corresponding to the first input signal and a second internal signal corresponding to the second input signal; a differential amplification circuit configured to generate an output signal by amplifying a difference between the first internal signal and the second internal signal; and a current valve including at least one transistor having a control electrode configured to receive the control signal, wherein the at least one transistor is connected in series to the differential amplification circuit and one of a positive voltage node having a positive supply voltage or a negative voltage node having a negative supply voltage.

According to embodiments, an integrated circuit includes a plurality of comparators, wherein each comparator of the plurality of comparators is configured to calibrate an offset according to a control signal; and an offset controller configured to generate the control signal for adjusting the offset in a calibration mode and generate a constant control signal in a normal mode, wherein the each comparator includes a differential amplification circuit configured to generate at least one output signal among a plurality of output signals by consuming a supply current; and a current valve configured to adjust at least a portion of the supply current based on the control signal.

BRIEF DESCRIPTION OF THE DRAWINGS

These and other aspects will be more clearly understood from the following detailed description taken in conjunction with the accompanying drawings in which.

DETAILED DESCRIPTION OF THE EMBODIMENTS

Embodiments provide a comparator providing high accuracy without sacrificing other characteristics and an integrated circuit including the comparator. The embodiments provided herein are all exemplary, and thus, the inventive concept is not limited thereto.

Figure 1A:
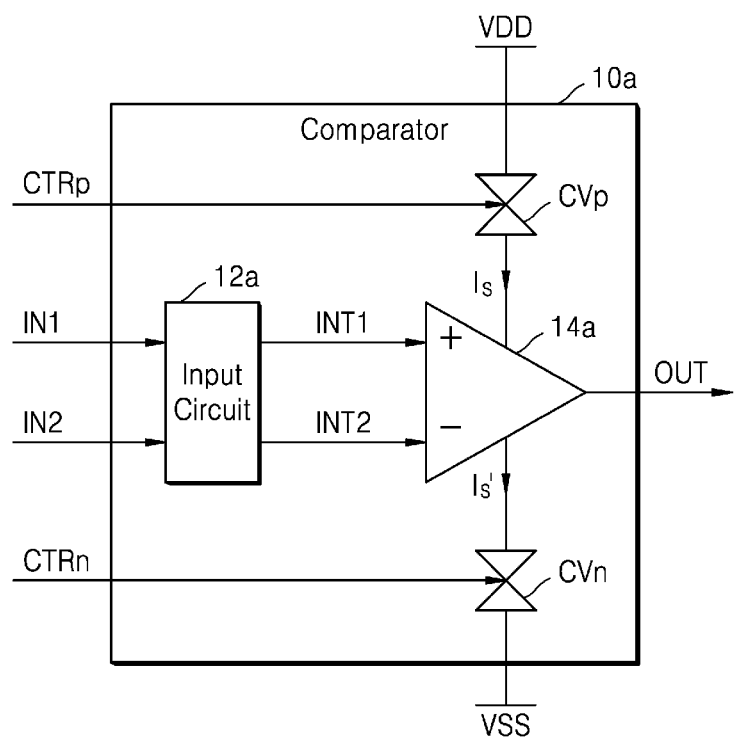
FIGS. 1A and 1B are block diagrams of examples of comparators according to embodiments.
Figure 1B:
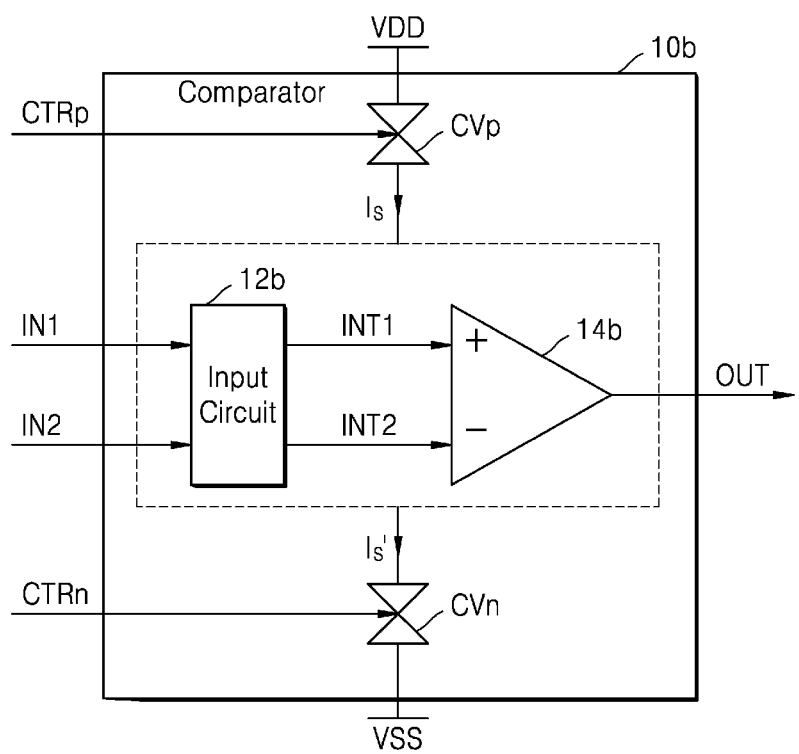

FIGS. 1A and 1B are block diagrams of examples of comparators according to embodiments. Hereinafter, a duplicated description with respect to FIGS. 1A and 1B will be omitted.

Referring to FIG. 1A, a comparator 10a may receive first and second input signals IN1 and IN2 and generate an output signal OUT by comparing the first and second input signals IN1 and IN2. For example, the comparator 10a may compare voltages of the first and second input signals IN1 and IN2, and the output signal OUT may have a high voltage (or a high level) when the voltage of the first input signal IN1 is higher than the voltage of the second input signal IN2, and have a low voltage (or a low level) when the voltage of the second input signal IN2 is higher than the voltage of the first input signal IN1. Hereinafter, embodiments will be described by mainly referring to a comparator for comparing voltages of input signals, but it will be understood that the embodiments may also be applied to other types of comparators, for example a comparator for comparing currents of input signals. The comparator 10a may be connected to a positive voltage node to which a positive supply voltage VDD is applied and a negative voltage node to which a negative supply voltage VSS, which may be referred to as a ground potential, is applied and may receive power from the positive voltage node and the negative voltage node. Hereinafter, the positive voltage node to which the positive supply voltage VDD is applied may be simply referred to as the positive supply voltage VDD, and the negative voltage node to which the negative supply voltage VSS is applied may be simply referred to as the negative supply voltage VSS. As shown in FIG. 1A, the comparator 10a may include an input circuit 12a, a differential amplification circuit 14a, and top and bottom current valves CVp and CVn.

The input circuit 12a may generate first and second internal signals INT1 and INT2 based on the first and second input signals IN1 and IN2. For example, the input circuit 12a may have a high input impedance and a low output impedance and generate the first and second internal signals INT1 and INT2 respectively corresponding to the first and second input signals IN1 and IN2. According to some embodiments, the input circuit 12a may include transistors to generate the first and second internal signals INT1 and INT2 respectively having inverted levels of the first and second input signals IN1 and IN2, as described below with reference to FIGS. 4, 8, and the like.

The differential amplification circuit 14a may receive the first and second internal signals INT1 and INT2 and generate the output signal OUT by amplifying a difference, for example a voltage difference, between the first and second internal signals INT1 and INT2. The differential amplification circuit 14a may have an arbitrary structure of amplifying the difference between the first and second internal signals INT1 and INT2, and according to some embodiments, as described below with reference to FIGS. 2A and 2B, the differential amplification circuit 14a may include cross coupled amplification circuits. The differential amplification circuit 14a may generate the output signal OUT as a single ended signal according to some embodiments and as a differential signal according to some other embodiments. The differential amplification circuit 14a may perform the amplification by consuming a supply current flowing from the positive supply voltage VDD to the negative supply voltage VSS via the differential amplification circuit 14a. For example, as shown in FIG. 1A, the differential amplification circuit 14a may receive a supply current $I_S$ from the positive supply voltage VDD and drain a supply current $I_S'$ to the negative supply voltage VSS. According to some embodiments, both the supply currents $I_S$ and $I_S'$ may have different magnitudes according to the first and second internal signals INT1 and INT2 and/or the output signal OUT, but it is assumed in the present specification that both the supply currents $I_S$ and $I_S'$ have substantially the same magnitude ($I_S=I_S'$).

The comparator 10a may include at least one current valve configured to adjust at least a portion of the supply current $I_S$ or $I_S'$ consumed by the differential amplification circuit 14a. In the present specification, current valve may refer to an element capable of adjusting, according to a control signal, a magnitude of a current passing therethrough or a circuit including the same. For example, as shown in FIG. 1A, the top current valve CVp may adjust, according to a top control signal CTRp, at least a portion of the supply current $I_S$ flowing from the positive supply voltage VDD to the differential amplification circuit 14a, and the bottom current valve CVn may adjust, according to a bottom control signal CTRn, at least a portion of the supply current $I_S'$ flowing from the differential amplification circuit 14a to the negative supply voltage VSS. According to some embodiments, the supply current $I_S$ or $I_S'$ may vary according to an operation of the differential amplification circuit 14a, the top current valve CVp may set an upper limit of the supply current $I_S$ according to the top control signal CTRp, and the bottom current valve CVn may set an upper limit of the supply current $I_S'$ according to the bottom control signal CTRn. According to some embodiments, the comparator 10a may include only one of the top current valve CVp and the bottom current valve CVn, and in the present specification, the top current valve CVp and the bottom current valve CVn may be collectively referred to as a current valve.

Due to a deviation between a first path on which the first input signal IN1 is processed and a second path on which the second input signal IN2 is processed, the comparator 10a may have an offset which may be an input offset. For example, the comparator 10a may generate the output signal OUT indicating that the first input signal IN1 is lower than the second input signal IN2 when a voltage of the first input signal IN1 is lower than a voltage obtained by adding a voltage of the second input signal IN2 and a positive offset voltage. As the offset increases, the accuracy of the comparator 10a may decrease, and thus, the comparator 10a may provide an operation for compensating for the offset, for example offset calibration. As shown in FIG. 1A, the comparator 10a may provide offset calibration for compensating for the offset by adjusting the supply current $I_S$ or $I_S'$ provided to or drained from the differential amplification circuit 14a, and accordingly, as described below with reference to FIG. 7, a wide offset adjustment range and a high offset adjustment resolution may be provided without influencing the other characteristics of the comparator 10a.

Referring to FIG. 1B, similarly to the comparator 10a in FIG. 1A, a comparator 10b may receive the first and second input signals IN1 and IN2, generate the output signal OUT, and include an input circuit 12b, a differential amplification circuit 14b, and the top and bottom current valves CVp and CVn. Compared to the top and bottom current valves CVp and CVn in FIG. 1A, the top current valve CVp in FIG. 1B may adjust, according to the top control signal CTRp, at least a portion of the supply current $I_S$ provided to not only the differential amplification circuit 14b but also the input circuit 12b, and the bottom current valve CVn in FIG. 1B may also adjust, according to the bottom control signal CTRn, at least a portion of the supply current $I_S'$ drained from not only the differential amplification circuit 14b but also the input circuit 12b. According to some embodiments, the input circuit 12a and the differential amplification circuit 14a in FIG. 1A may be connected in parallel between the positive supply voltage VDD and the negative supply voltage VSS, whereas the input circuit 12b and the differential amplification circuit 14b in FIG. 1B may be connected in series between the positive supply voltage VDD and the negative supply voltage VSS. In addition, according to some embodiments, unlike shown in FIG. 1B, the comparator 10b may include only one of the top current valve CVp and the bottom current valve CVn.

Figure 2A:
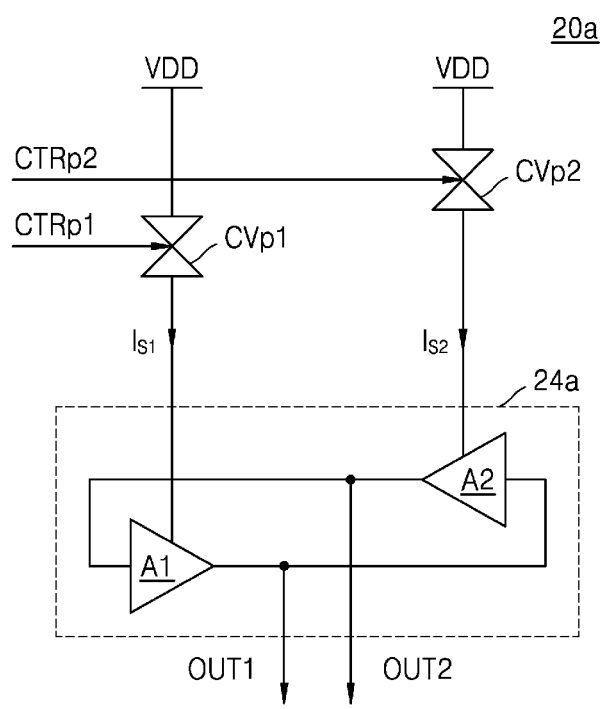
FIGS. 2A and 2B are block diagrams of examples of comparators according to embodiments.
Figure 2B:
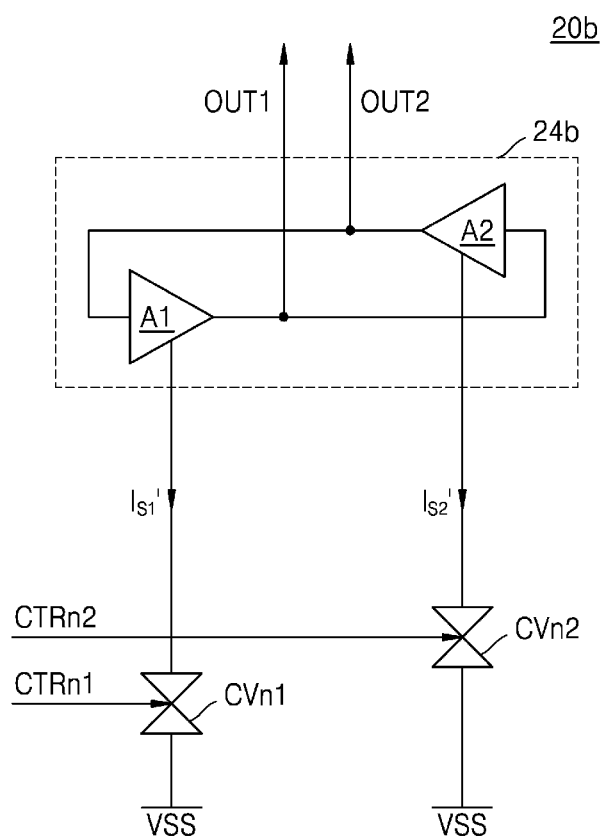

FIGS. 2A and 2B are block diagrams of examples of comparators according to embodiments. In detail, the block diagram of FIG. 2A illustrates an example of a differential amplification circuit and a top current valve, and the block diagram of FIG. 2B illustrates an example of a differential amplification circuit and a bottom current valve.

Referring to FIG. 2A, a comparator 20a may include a differential amplification circuit 24a and first and second top current valves CVp1 and CVp2. The differential amplification circuit 24a may include first and second amplification circuits A1 and A2 which respectively generate complementary first and second output signals OUT1 and OUT2 and are cross-coupled, and the first and second top current valves CVp1 and CVp2 may adjust first and second supply currents $I_{S1}$ and $I_{S2}$ provided to the first and second amplification circuits A1 and A2, respectively. The first top current valve CVp1 may adjust the first supply current $I_{S1}$ based on a first top control signal CTRp1, the second top current valve CVp2 may adjust the second supply current $I_{S2}$ based on a second top control signal CTRp2, and a value of at least one of the first and second top control signals CTRp1 and CTRp2 may be determined according to a sign and a magnitude of an offset.

Referring to FIG. 2B, a comparator 20b may include a differential amplification circuit 24b and first and second bottom current valves CVn1 and CVn2. The differential amplification circuit 24b may include the first and second amplification circuits A1 and A2 which respectively generate the complementary first and second output signals OUT1 and OUT2 and are cross-coupled, and the first and second bottom current valves CVn1 and CVn2 may adjust first and second supply currents $I_{S1}'$ and $I_{S2}'$ drained from the first and second amplification circuits A1 and A2, respectively. The first bottom current valve CVn1 may adjust the first supply current $I_{S1}'$ based on a first bottom control signal CTRn1, the second bottom current valve CVn2 may adjust the second supply current $I_{S2}'$ based on a second bottom control signal CTRn2, and a value of at least one of the first and second bottom control signals CTRn1 and CTRn2 may be determined according to a sign and a magnitude of an offset.

Figure 3A:
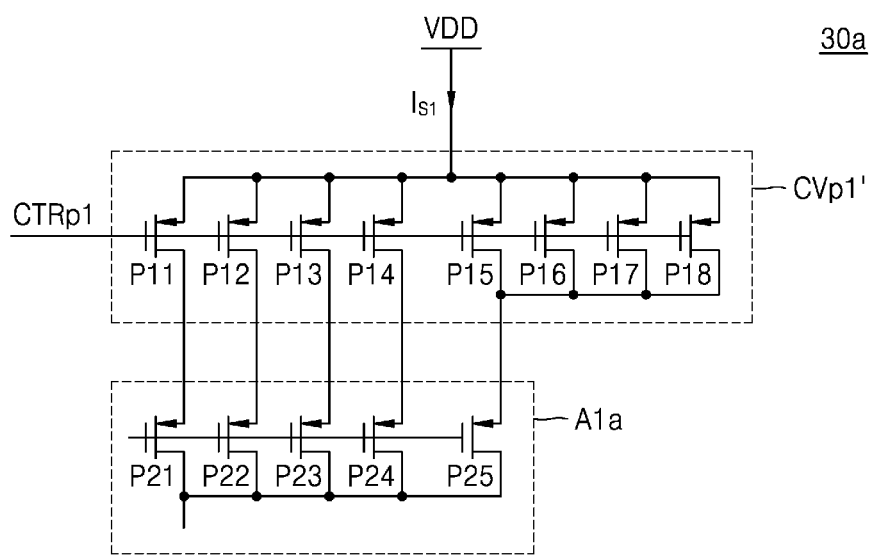
FIGS. 3A and 3B are circuit diagrams of examples of comparators according to embodiments.
Figure 3B:
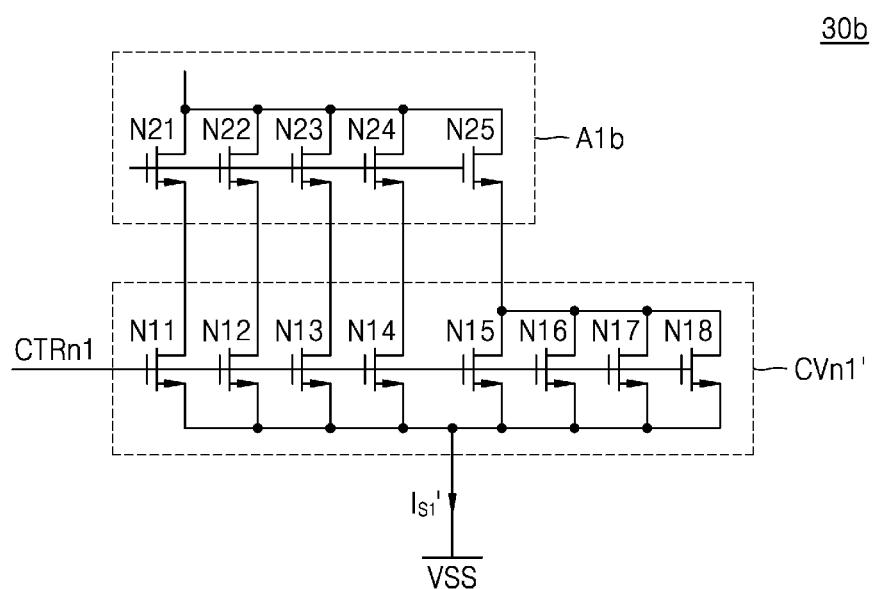

FIGS. 3A and 3B are circuit diagrams of examples of comparators according to embodiments. In detail, the circuit diagram in FIG. 3A illustrates an example of a portion of the first amplification circuit A1 and the first top current valve CVp1 in FIG. 2A, and the circuit diagram in FIG. 3B illustrates an example of a portion of the first amplification circuit A1 and the first bottom current valve CVn1 in FIG. 2B. According to some embodiments, the portion of the second amplification circuit A2 and the second top current valve CVp2 in FIG. 2A may also have a similar structure to that shown in FIG. 3A, and the portion of the second amplification circuit A2 and the second bottom current valve CVn2 in FIG. 2B may also have a similar structure to that shown in FIG. 3B.

Referring to FIG. 3A, a comparator 30a may include a first amplification circuit A1a and a first top current valve CVp1'. The first top current valve CVp1' may adjust, based on the first top control signal CTRp1, the first supply current $I_{S1}$ provided from the positive supply voltage VDD to the first amplification circuit A1a. As shown in FIG. 3A, the first top current valve CVp1' may include a plurality of first transistors P11 to P18 respectively having control electrodes, which receive the first top control signal CTRp1, and connected in series to the positive supply voltage VDD and the first amplification circuit A1a. According to some embodiments, the plurality of first transistors P11 to P18 may be p-channel field effect transistors (PFETs) and have different sizes, for example different current driving capabilities. According to some embodiments, the first top current valve CVp1' may include a different number of first transistors from those shown in FIG. 3A.

According to some embodiments, the first top control signal CTRp1 may be a multi-bit signal as a digital signal, and each of the plurality of first transistors P11 to P18 may be turned on or off by receiving one bit of the first top control signal CTRp1. According to some other embodiments, the first top control signal CTRp1 may have a continuously variable voltage as an analog signal, and each of the plurality of first transistors P11 to P18 may operate in a triode region according to the voltage of the first top control signal CTRp1.

The first amplification circuit A1a may include a plurality of second transistors P21 to P25 connected to the first top current valve CVp1'. As shown in FIG. 3A, the plurality of second transistors P21 to P25 may respectively have control electrodes commonly connected, first electrodes commonly connected, and second electrodes each connected to at least one of the plurality of first transistors P11 to P18. For example, the plurality of second transistors P21 to P25 may be PFETs and have gates commonly connected and drains commonly connected. In addition, each of the plurality of second transistors P21 to P25 may have a source connected to at least one of the plurality of first transistors P11 to P18. Accordingly, at a node connected to the drains of the plurality of second transistors P21 to P25, a load, for example capacitance, according to the plurality of second transistors P21 to P25 may function regardless of states, for example a turn-on or turn-off state, of the plurality of first transistors P11 to P18, and accordingly, the other characteristics of the comparator 30a may not be influenced therefrom.

According to some embodiments, the plurality of second transistors P21 to P25 may have different sizes, i.e., different current driving capabilities. In addition, according to some embodiments, the first amplification circuit A1a may include a different number of second transistors from those shown in FIG. 3A, which are connected to the first top current valve CVp1'. In the drawings attached to the present specification, transistors in a differential amplification circuit connected to a top current valve, such as the plurality of second transistors P21 to P25 in FIG. 3A, may be shown as a single transistor drawn to be thick.

The plurality of first transistors P11 to P18 in the first top current valve CVp1' may include first transistors providing coarse tuning of the first supply current $I_{S1}$ and first transistors providing fine tuning of the first supply current $I_{S1}$. For example, as shown in FIG. 3A, four first transistors P11 to P14 respectively connected to four second transistors P21 to P24 may coarsely adjust the first supply current $I_{S1}$ according to the first top control signal CTRp1, and four first transistors P15 to P18 commonly connected to one second transistor P25 may finely adjust the first supply current $I_{S1}$ according to the first top control signal CTRp1. A magnitude of the first supply current $I_{S1}$ adjusted according to the first top control signal CTRp1 may depend on not only a connection relationship between the plurality of first transistors P11 to P18 and the plurality of second transistors P21 to P25 but also sizes, for example current driving capabilities, of the plurality of first transistors P11 to P18 and the plurality of second transistors P21 to P25. An example of such an adjustment according to an embodiment will be described below with reference to FIG. 5.

Referring to FIG. 3B, a comparator 30b may include a first amplification circuit A1b and a first bottom current valve CVn1'. The first bottom current valve CVn1' may adjust, based on the first bottom control signal CTRn1, the first supply current $I_{S1}$' drained from the first amplification circuit A1b to the negative supply voltage VSS. As shown in FIG. 3B, the first bottom current valve CVn1' may include a plurality of first transistors N11 to N18 respectively having control electrodes, which receive the first bottom control signal CTRn1, and connected in series to the negative supply voltage VSS and the first amplification circuit A1b. According to some embodiments, the plurality of first transistors N11 to N18 may be n-channel field effect transistors (NFETs) and have different sizes, for example different current driving capabilities. According to some embodiments, the first bottom current valve CVn1' may include a different number of first transistors from those shown in FIG. 3B.

According to some embodiments, the first bottom control signal CTRn1 may be a multi-bit signal as a digital signal, and each of the plurality of first transistors N11 to N18 may be turned on or off by receiving one bit of the first bottom control signal CTRn1. According to some other embodiments, the first bottom control signal CTRn1 may have a continuously variable voltage as an analog signal, and each of the plurality of first transistors N11 to N18 may operate in a triode region according to the voltage of the first bottom control signal CTRn1.

The first amplification circuit A1b may include a plurality of second transistors N21 to N25 connected to the first bottom current valve CVn1'. As shown in FIG. 3B, the plurality of second transistors N21 to N25 may respectively have control electrodes commonly connected, first electrodes commonly connected, and second electrodes each connected to at least one of the plurality of first transistors N11 to N18. For example, the plurality of second transistors N21 to N25 may be NFETs and have gates commonly connected and drains commonly connected. In addition, each of the plurality of second transistors N21 to N25 may have a source connected to at least one of the plurality of first transistors N11 to N18. According to some embodiments, the plurality of second transistors N21 to N25 may have different sizes, i.e., different current driving capabilities. In addition, according to some embodiments, the first amplification circuit A1b may include a different number of second transistors from those shown in FIG. 3B, which are connected to the first bottom current valve CVn1'. In the drawings attached to the present specification, transistors in a differential amplification circuit connected to a bottom current valve, such as the plurality of second transistors N21 to N25 in FIG. 3B, may be shown as a single transistor drawn to be thick.

Similarly to that described above with reference to FIG. 3A, four first transistors N11 to N14 among the plurality of first transistors N11 to N18 may provide coarse tuning of the first supply current $I_{S1}$', and the other four first transistors N15 to N18 may provide fine tuning of the first supply current $I_{S1}$'.

Hereinafter, the example embodiments will be described by mainly referring to a comparator including a PFET or an NFET as an example of a transistor, but it will be understood that the embodiments are also applicable to a comparator including transistors such as unipolar transistors including an FET, bipolar transistors including a bipolar junction transistor (BJT), and the like.

Figure 4:
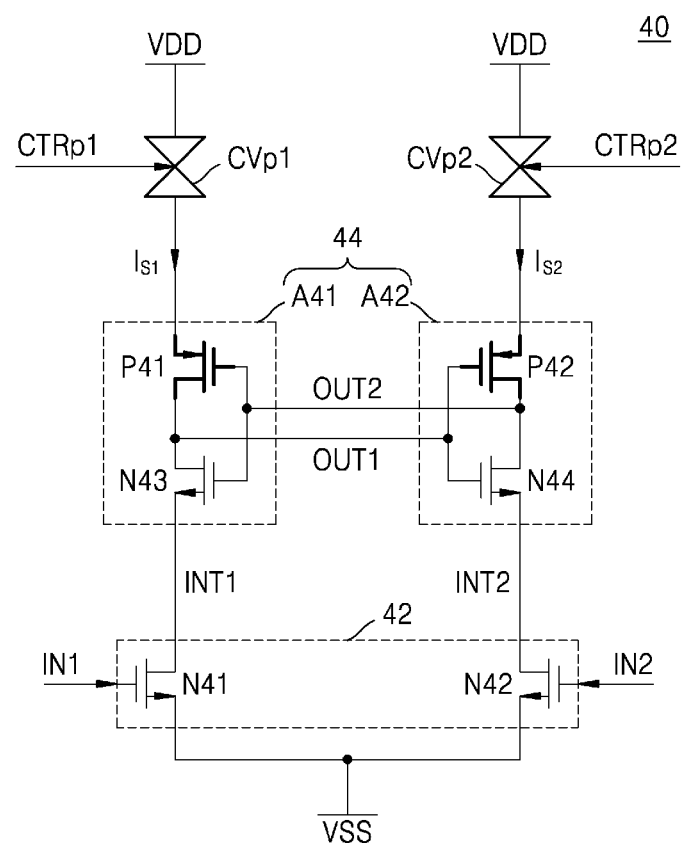
FIG. 4 is a circuit diagram of an example of a comparator according to an embodiment.

FIG. 4 is a circuit diagram of an example of a comparator according to an embodiment. In detail, the circuit diagram in FIG. 4 illustrates an example of a comparator 40 including an input circuit 42 and a differential amplification circuit 44 connected in series between the positive supply voltage VDD and the negative supply voltage VSS and including the first and second top current valves CVp1 and CVp2, similarly to the comparator 10b in FIG. 1B.

Referring to FIG. 4, the input circuit 42 may include first and second NFETs N41 and N42 respectively receiving the first and second input signals IN1 and IN2. The first and second NFETs N41 and N42 may respectively pass the first and second supply currents $I_{S1}$ and $I_{S2}$ therethrough and provide the first and second internal signals INT1 and INT2 to the differential amplification circuit 44.

The differential amplification circuit 44 may include first and second amplification circuits A41 and A42 which respectively generate the complementary first and second output signals OUT1 and OUT2 and are cross-coupled The first amplification circuit A41 may include a third NFET N43 connected to the input circuit 42, and a first PFET P41 connected to the first top current valve CVp1. In addition, the second amplification circuit A42 may include a fourth NFET N44 connected to the input circuit 42, and a second PFET P42 connected to the second top current valve CVp2. As described above with reference to FIG. 3A, the first PFET P41 may include a plurality of PFETs, and the second PFET P42 may also include a plurality of PFETs.

The first top current valve CVp1 may adjust the first supply current $I_{S1}$ based on the first top control signal CTRp1, the second top current valve CVp2 may adjust the second supply current $I_{S2}$ based on the second top control signal CTRp2. As described above with reference to FIG. 3A, the first top current valve CVp1 may include a plurality of PFETs, and the first supply current $I_{S1}$ may flow from the first top current valve CVp1 to the first PFET P41 via a plurality of lines. Likewise, the second top current valve CVp2 may include a plurality of PFETs, and the second supply current $I_{S2}$ may flow from the second top current valve CVp2 to the second PFET P42 via a plurality of lines.

Figure 5:
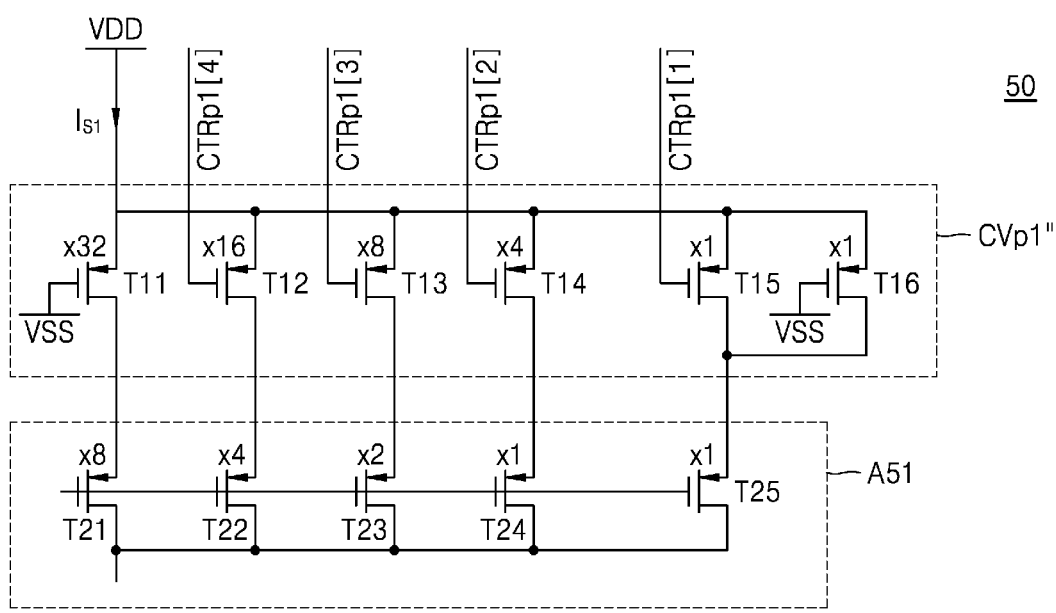
FIG. 5 is a circuit diagram of an example of a comparator according to an embodiment.

FIG. 5 is a circuit diagram of an example of a comparator according to an embodiment. In detail, the circuit diagram in FIG. 5 illustrates an example of the first top current valve CVp1 and the first amplification circuit A41 in FIG. 4. As shown in FIG. 5, a comparator 50 may include a first amplification circuit A51 and a first top current valve CVp1". According to some embodiments, the first top current valve CVp1" and the first amplification circuit A51 in FIG. 5 may be an example of or otherwise correspond to the second top current valve CVp2 and the second amplification circuit A42 in FIG. 4 or may be included in comparators different from the comparator 40 in FIG. 4.

Referring to FIG. 5, the first top current valve CVp1" may include a plurality of first transistors T11 to T16. The first top current valve CVp1" may adjust, based on a 4-bit first top control signal CTRp1[4:1], the first supply current $I_{S1}$ provided from the positive supply voltage VDD to the first amplification circuit A51. The first top current valve CVp1" may include four first transistors T12 to T15 having gates receiving respective bits of the first top control signal CTRp1[4:1], and each of the four first transistors T12 to T15 may be turned on or off according to the first top control signal CTRp1[4:1]. In the present specification, like the four first transistors T12 to T15, a transistor controlled according to a control signal may be referred to as a dynamically controlled transistor. The first top current valve CVp1" may include not only the dynamically controlled transistors but also two first transistors T11 and T16 having gates receiving the negative supply voltage VSS, and accordingly, the two first transistors T11 and T16 may operate in a triode region according to a drain voltage. In the present specification, like the two first transistors T11 and T16, a transistor having a gate to which a constant voltage is applied may be referred to as a statically controlled transistor.

The first amplification circuit A51 may include a plurality of second transistors T21 to T25, wherein four second transistors T21 to T24 among the plurality of second transistors T21 to T25 may be respectively connected to four first transistors T11 to T14, and the remaining second transistor T25 may be connected to two first transistors T15 and T16. As described above with reference to FIGS. 3A and 3B, the four first transistors T11 to T14 may provide coarse tuning of the first supply current $I_{S1}$, and the two first transistors T15 and T16 may provide fine tuning of the first supply current $I_{S1}$.

According to some embodiments, each of the plurality of first transistors T11 to T16 included in the first top current valve CVp1" may have a size, for example a current driving capability, greater than or equal to that of a second transistor connected thereto. For example, as shown in FIG. 5, the first transistor T12 receiving a fourth bit CTRp1[4] of the first top control signal CTRp1[4:1] may have a size of 'x16', and the second transistor T22 connected to the first transistor T12 may have a size of 'x4'. In addition, at least some of the plurality of second transistors T21 to T25 may have different sizes, and each of the plurality of first transistors T11 to T16 may have a size proportional to a size of a second transistor connected thereto. In the present specification, a size of a transistor may be referred to as a current driving capability of the transistor and may be determined by a channel width and a channel length of the transistor. For example, when channel lengths of transistors included in the comparator 50 are identical, a size of a transistor may be proportional to a channel width thereof. In addition, when the comparator 50 includes unit transistors having the same channel width and channel length, a size of a transistor may be determined by the number of unit transistors connected in parallel.

According to some embodiments, when the first top current valve CVp1 and the first amplification circuit A41 in the comparator 40 of FIG. 4 are implemented to be the same as the first top current valve CVp1" and the first amplification circuit A51 in FIG. 5, an offset may vary as in Table 1 according to the first top control signal CTRp1[4:1]

TABLE 1

| CTRp1[4:1] | 0000 | 0001 | 0010 | ... | 1101 | 1110 | 1111 |
|---|---|---|---|---|---|---|---|
| Offset(mV) | 0 | 1 | 2 | ... | 13 | 14 | 15 |

Similarly to that shown in FIG. 5, a bottom current valve may include a plurality of first transistors, for example NFETs, and each of the plurality of first transistors may have a size, for example a current driving capability, greater than that of a second transistor of an amplification circuit, which is connected thereto, and have the current driving capability proportional to that of the second transistor. In addition, according to some embodiments, a plurality of first transistors included in a bottom current valve may include at least one dynamically controlled transistor and at least one statically controlled transistor, for example a transistor having a gate receiving the positive supply voltage VDD. In addition, the dynamically controlled transistor among the plurality of first transistors included in the bottom current valve may have a gate receiving one bit of a bottom control signal.

Figure 6A:
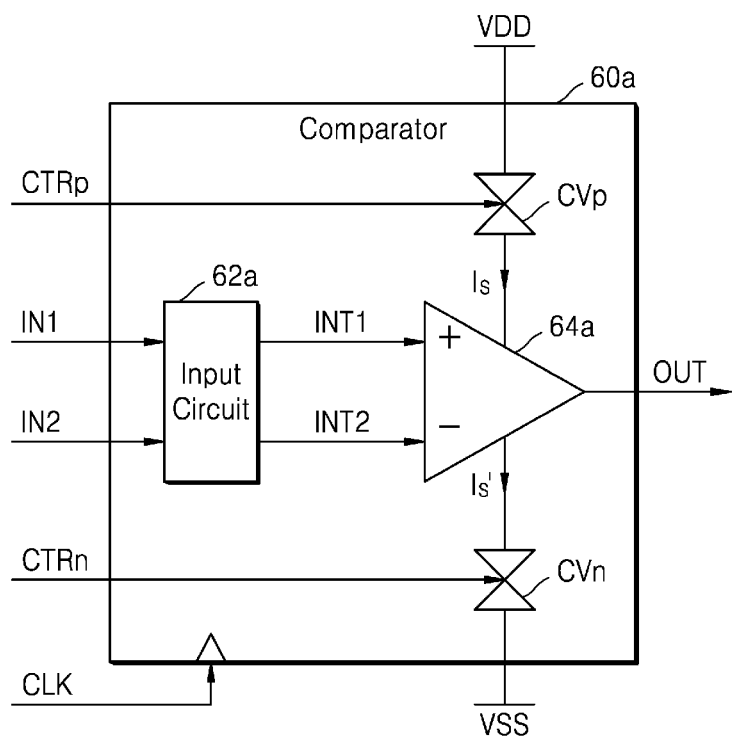
FIGS. 6A and 6B are block diagrams of examples of comparators according to embodiments.
Figure 6B:
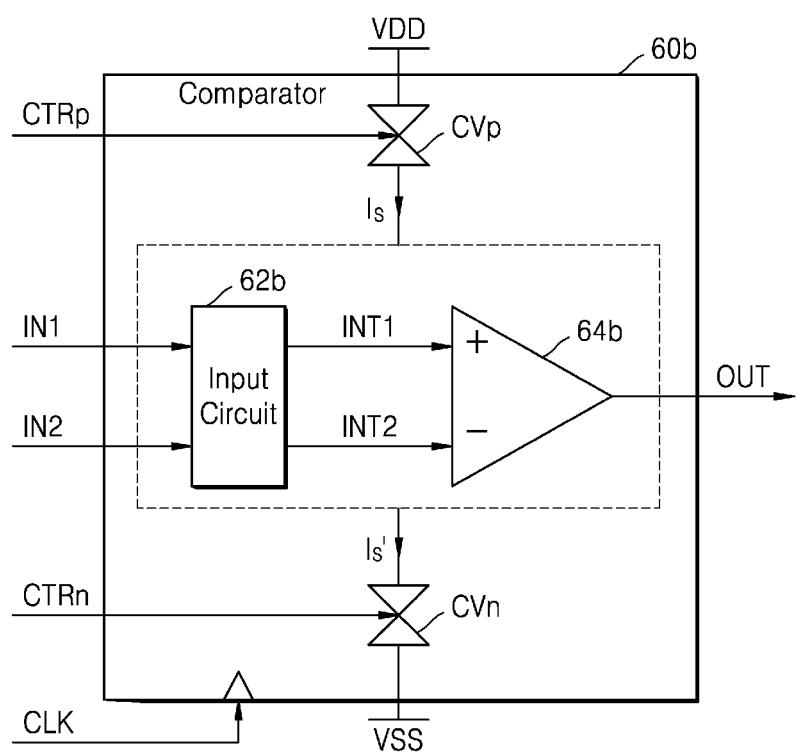

FIGS. 6A and 6B are block diagrams of examples of comparators according to embodiments. In detail, the block diagrams of FIGS. 6A and 6B illustrate dynamic comparators receiving a clock signal CLK. The description made with reference to FIGS. 1A and 1B is not repeated again in a description to be made with reference to FIGS. 6A and 6B.

Referring to FIG. 6A, a comparator 60a may include an input circuit 62a and a differential amplification circuit 64a. In addition, the comparator 60a may include the top current valve CVp and the bottom current valve CVn, and according to some embodiments, the comparator 60a may include only one of the top current valve CVp and the bottom current valve CVn. The comparator 60a may receive the clock signal CLK and generate the output signal OUT corresponding to a comparison result of the first and second input signals IN1 and IN2 in response to a rising edge or a falling edge of the clock signal CLK. As described above, the comparator 60a which generates the output signal OUT in response to the clock signal CLK may be referred to as a dynamic comparator, and the dynamic comparator may reduce static power consumption. At least one of the input circuit 62a and the differential amplification circuit 64a may receive the clock signal CLK, and examples of the comparator 60a will be described below with reference to FIGS. 8 to 10B.

Referring to FIG. 6B, a comparator 60b may include an input circuit 62b and a differential amplification circuit 64b. In addition, the comparator 60b may include the top current valve CVp and the bottom current valve CVn, and according to some embodiments, the comparator 60b may include only one of the top current valve CVp and the bottom current valve CVn. The comparator 60b may receive the clock signal CLK and generate the output signal OUT corresponding to a comparison result of the first and second input signals IN1 and IN2 in response to a rising edge or a falling edge of the clock signal CLK. At least one of the input circuit 62b and the differential amplification circuit 64b may receive the clock signal CLK, and examples of the comparator 60b will be described below with reference to FIG. 7.

Hereinafter, as described below with reference to the drawings, the top current valve CVp in FIGS. 6A and 6B may be arranged at a side of the positive supply voltage VDD on a path irrelevant to the clock signal CLK. In addition, the bottom current valve CVn in FIGS. 6A and 6B may be arranged at a side of the negative supply voltage VSS on a path irrelevant to the clock signal CLK.

Figure 7:
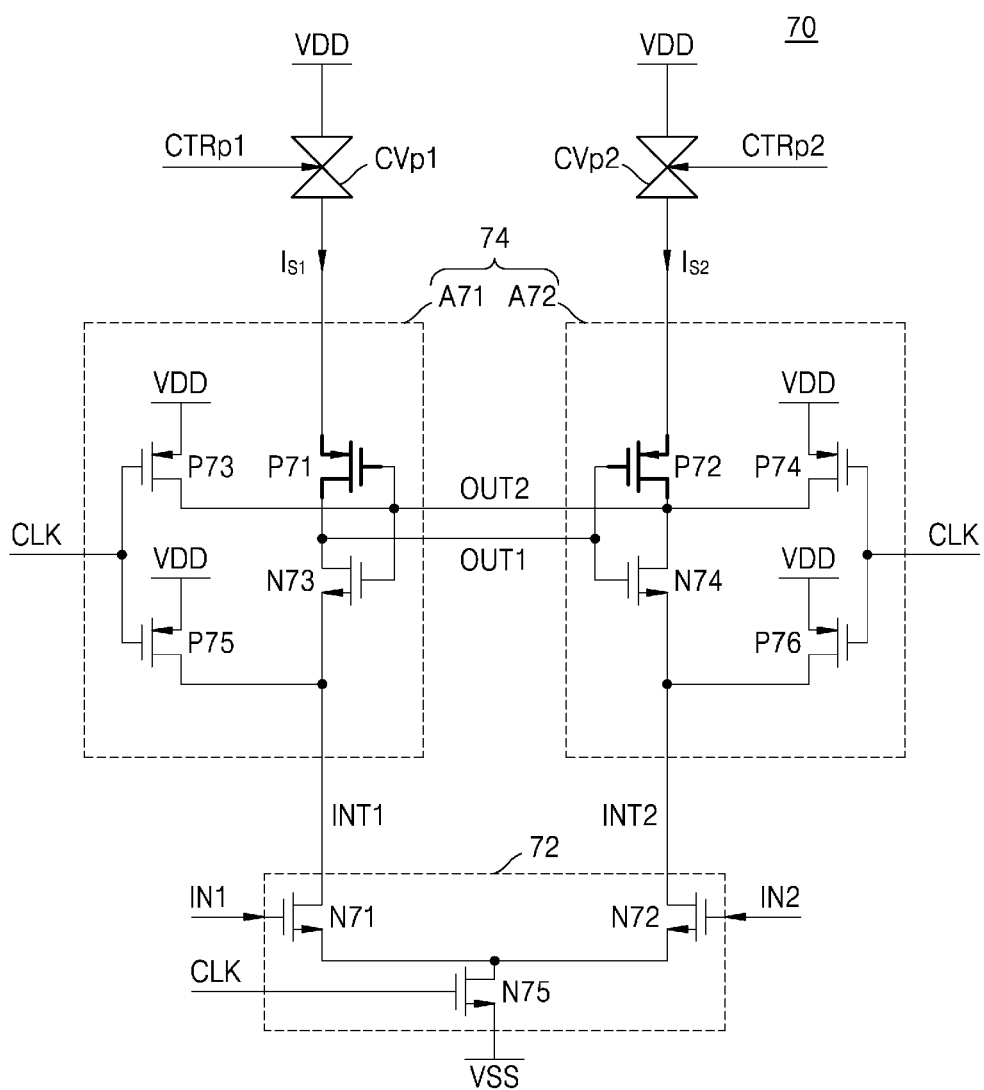
FIG. 7 is a circuit diagram of an example of a comparator according to an embodiment.

FIG. 7 is a circuit diagram of an example of a comparator according to an embodiment. In detail, the circuit diagram in FIG. 7 illustrates an example of a comparator 70 which includes an input circuit 72 and a differential amplification circuit 74 connected in series between the positive supply voltage VDD and the negative supply voltage VSS, includes the first and second top current valves CVp1 and CVp2, and receives the clock signal CLK, similarly to the comparator 60b in FIG. 6B. Compared to the comparator 40 in FIG. 4, the comparator 70 in FIG. 7 is a dynamic comparator and may further include third and sixth PFETs P73 to P76 and a fifth NFET N75 which receive the clock signal CLK. The description made with reference to FIG. 4 is not repeated again in a description to be made with reference to FIG. 7.

The input circuit 72 may include first and second NFETs N71 and N72 respectively receiving the first and second input signals IN1 and IN2 and further include the fifth NFET N75 receiving the clock signal CLK. The differential amplification circuit 74 may include first and second amplification circuits A71 and A72. The first amplification circuit A71 may include a first PFET P71 and a third NFET N73 which receive the second output signal OUT2 and generate the first output signal OUT1, and further include the third and the fifth PFETs P73 and P75 receiving the clock signal CLK. In addition, the second amplification circuit A72 may include a second PFET P72 and a fourth NFET N74 which receive the first output signal OUT1 and generate the second output signal OUT2, and further include the fourth and the sixth PFETs P74 and P76 receiving the clock signal CLK. The first top current valve CVp1 may be connected to the first PFET P71 drawn to be thick, and the second top current valve CVp2 may be connected to the second PFET P72, which in this illustration is drawn to be thick.

When the clock signal CLK has a low level, the fifth NFET N75 may cause the first and second supply currents $I_{S1}$ and $I_{S2}$ to be zero. In addition, nodes at which the first and second internal signals INT1 and INT2 are generated by the fifth and sixth PFETs P75 and P76 may be pre-charged to the positive supply voltage VDD, and nodes at which the first and second output signals OUT1 and OUT2 are generated by the third and fourth PFETs P73 and P74 may also be pre-charged to the positive supply voltage VDD. At the rising edge of the clock signal CLK, the fifth NFET N75 may be turned on, and the third to sixth PFETs P73 to P76 may be turned off, and accordingly, the first and second output signals OUT1 and OUT2 corresponding to a comparison result of the first and second input signals IN1 and IN2 may be generated.

Unlike the comparator 70 in FIG. 7, which includes the first and second top current valves CVp1 and CVp2 respectively controlled by the first and second top control signals CTRp1 and CTRp2, a structure of adjusting a load capacitance of a comparator to calibrate an offset may be considered. For example, variable capacitors may be respectively added to nodes at which the first and second internal signals INT1 and INT2 are generated, and an offset may be compensated by adjusting capacitances of the variable capacitors. However, the structure of adjusting a load capacitance may cause a large amount of power to be consumed, and may cause an operating speed of the comparator to be lowered. Alternatively, a structure including an additional pull-down path to calibrate an offset may be considered. For example, two NFETs respectively connected in parallel to the first and second NFETs N71 and N72 and having gates receiving a control signal may be further included. However, the structure including an additional pull-down path may cause addition of an analog circuit such as a charge pump to continuously adjust gate voltages of the additional NFETs and may have a weak noise characteristic.

On the other hand, as shown in FIG. 7, a comparator including a current valve for offset calibration may provide a wide offset adjustment range and a high offset adjustment resolution without influencing the other characteristics of the comparator, for example an operating speed, power consumption, a noise property, an area, and the like.

Figure 8:
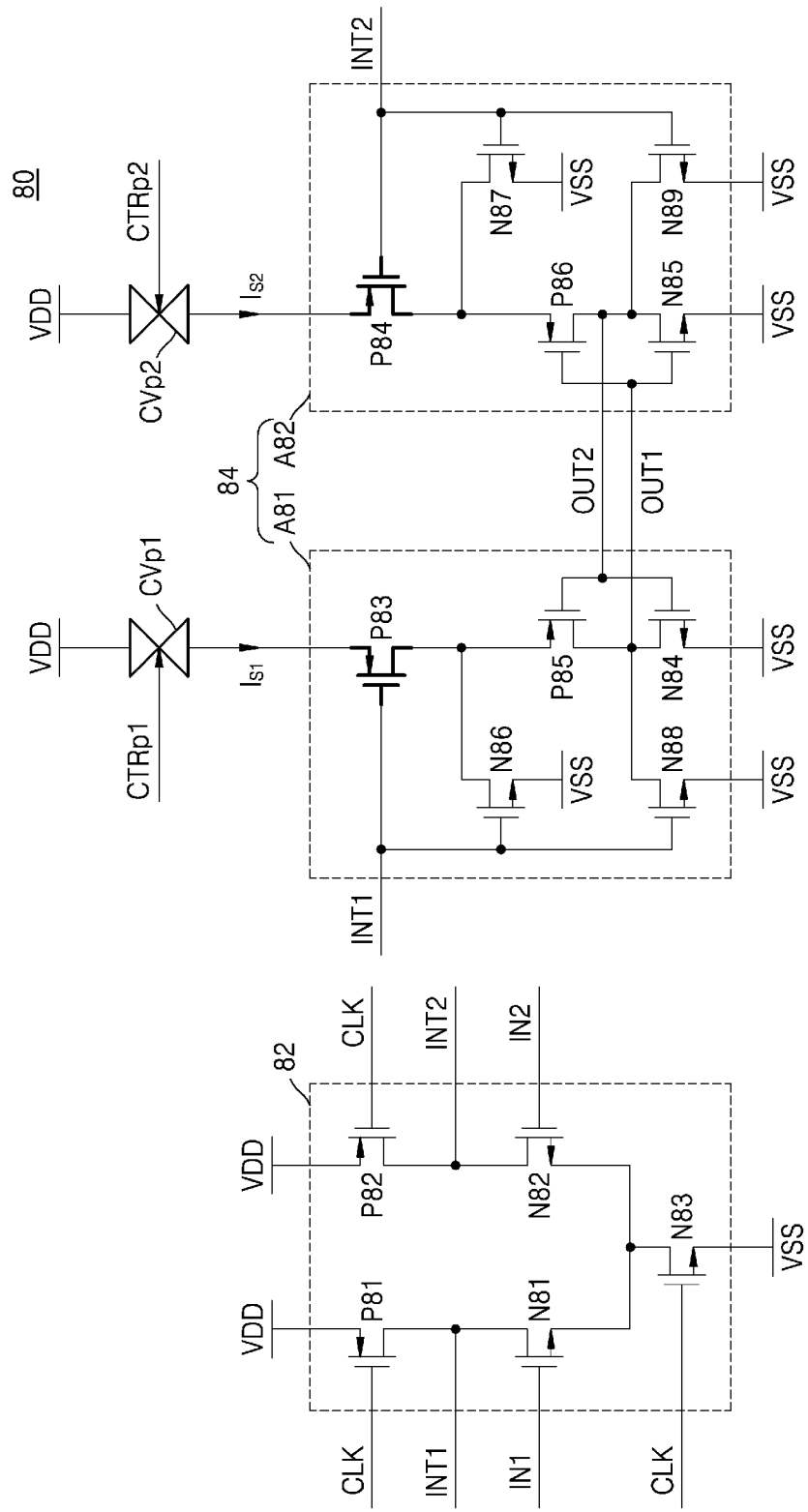
FIG. 8 is a circuit diagram of an example of a comparator according to an embodiment.

FIG. 8 is a circuit diagram of an example of a comparator according to an embodiment. In detail, the circuit diagram in FIG. 8 illustrates an example of a comparator 80 which includes an input circuit 82 and a differential amplification circuit 84 connected in parallel between the positive supply voltage VDD and the negative supply voltage VSS, includes the first and second top current valves CVp1 and CVp2, and receives the clock signal CLK, similarly to the comparator 60a in FIG. 6A. According to some embodiments, the comparator 80 in FIG. 8 may be referred to as a Miyahara comparator including a top current valve.

The input circuit 82 may include first and second NFETs N81 and N82 respectively receiving the first and second input signals IN1 and IN2 and include a third NFET N83 and first and second PFETs P81 and P82 which receive the clock signal CLK. The differential amplification circuit 84 may include first and second amplification circuits A81 and A82. The first amplification circuit A81 may include a fifth PFET P85 and a fourth NFET N84 which receive the second output signal OUT2 and generate the first output signal OUT1 and may include a third PFET P83 and sixth and eighth NFETs N86 and N88 which receive the first internal signal INT1. In addition, the second amplification circuit A82 may include a sixth PFET P86 and a fifth NFET N85 which receive the first output signal OUT1 and generate the second output signal OUT2 and may include a fourth PFET P84 and seventh and ninth NFETs N87 and N89 which receive the second internal signal INT2. The first top current valve CVp1 may be connected to the third PFET P83 drawn to be thick, and the second top current valve CVp2 may be connected to the fourth PFET P84 drawn to be thick.

When the clock signal CLK has the low level, nodes at which the first and second internal signals INT1 and INT2 are generated by the third NFET N83 and the first and second PFETs P81 and P82 may be pre-charged to the positive supply voltage VDD. In the rising edge of the clock signal CLK, the third NFET N83 may be turned on, and the first and second PFETs P81 and P82 may be turned off, and accordingly, the first and second output signals OUT1 and OUT2 corresponding to a comparison result of the first and second input signals IN1 and IN2 may be generated.

Figure 9A:
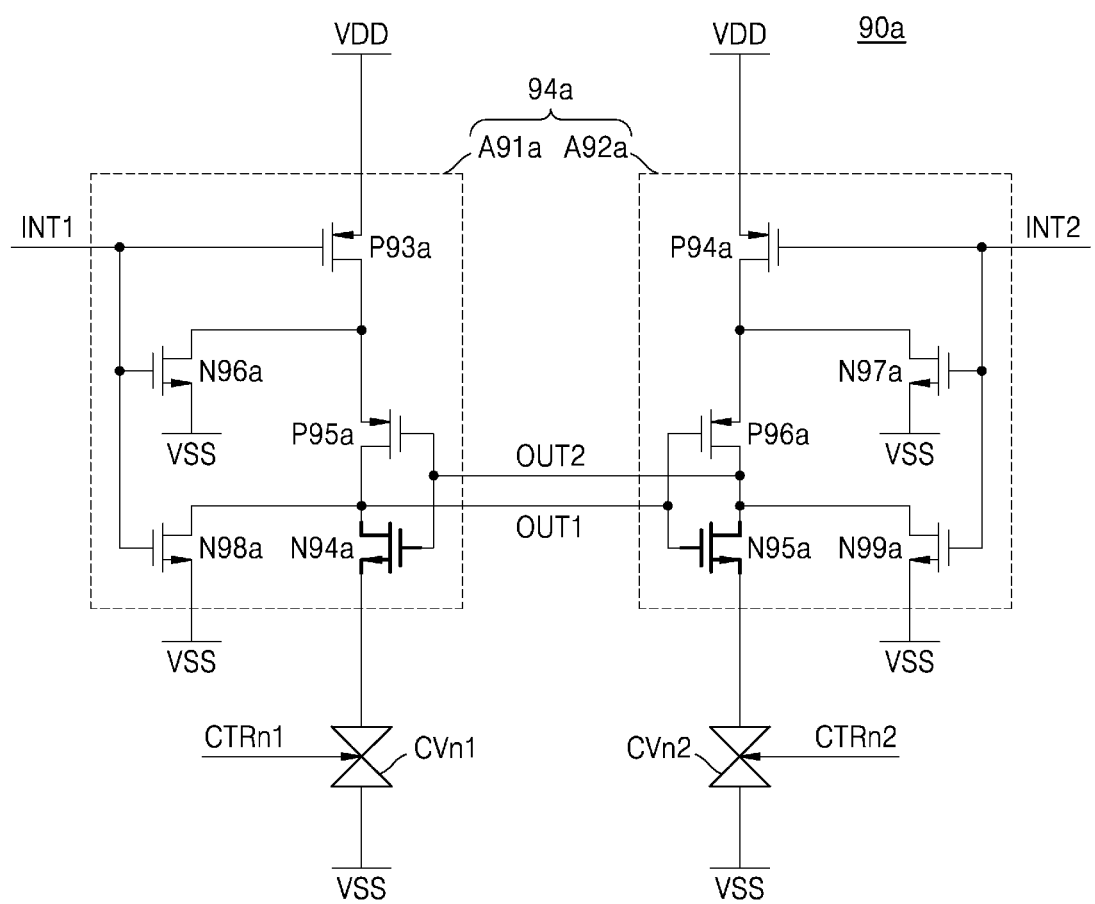
FIGS. 9A, 9B, and 9C are circuit diagrams of examples of comparators according to embodiments.
Figure 9B:
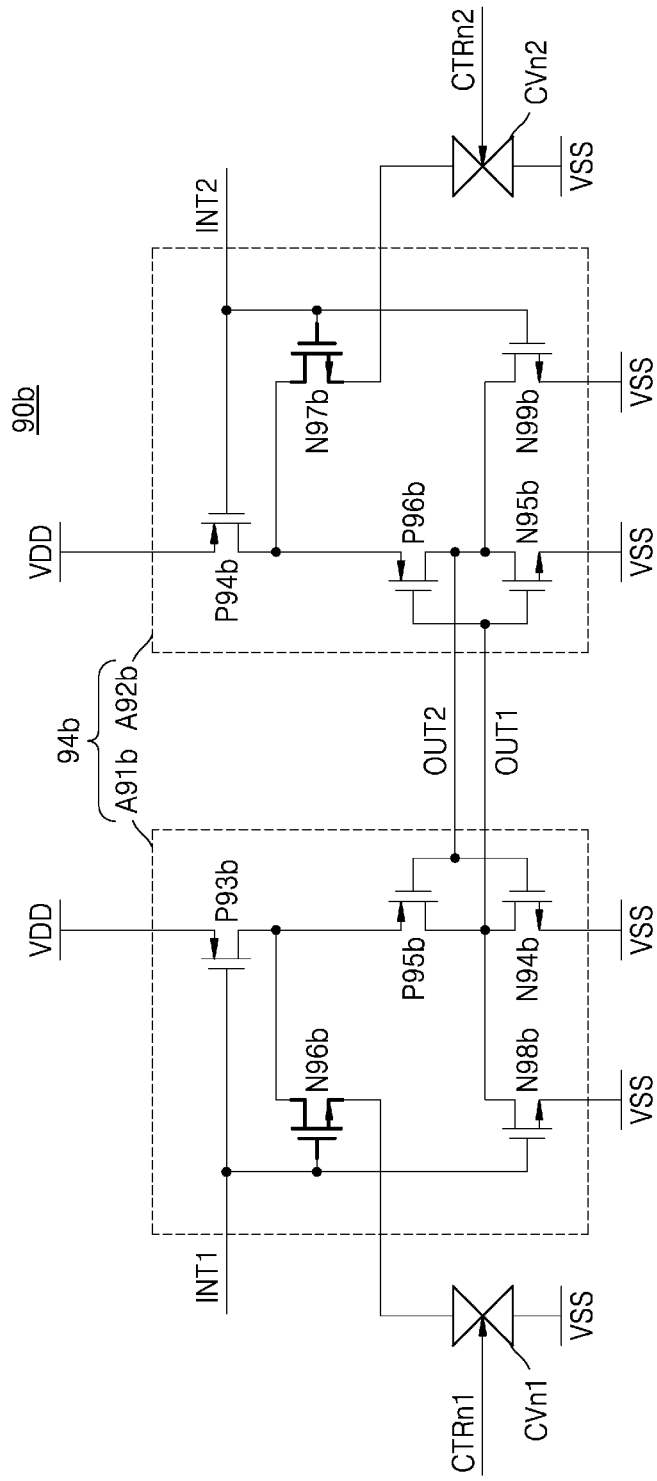
Figure 9C:
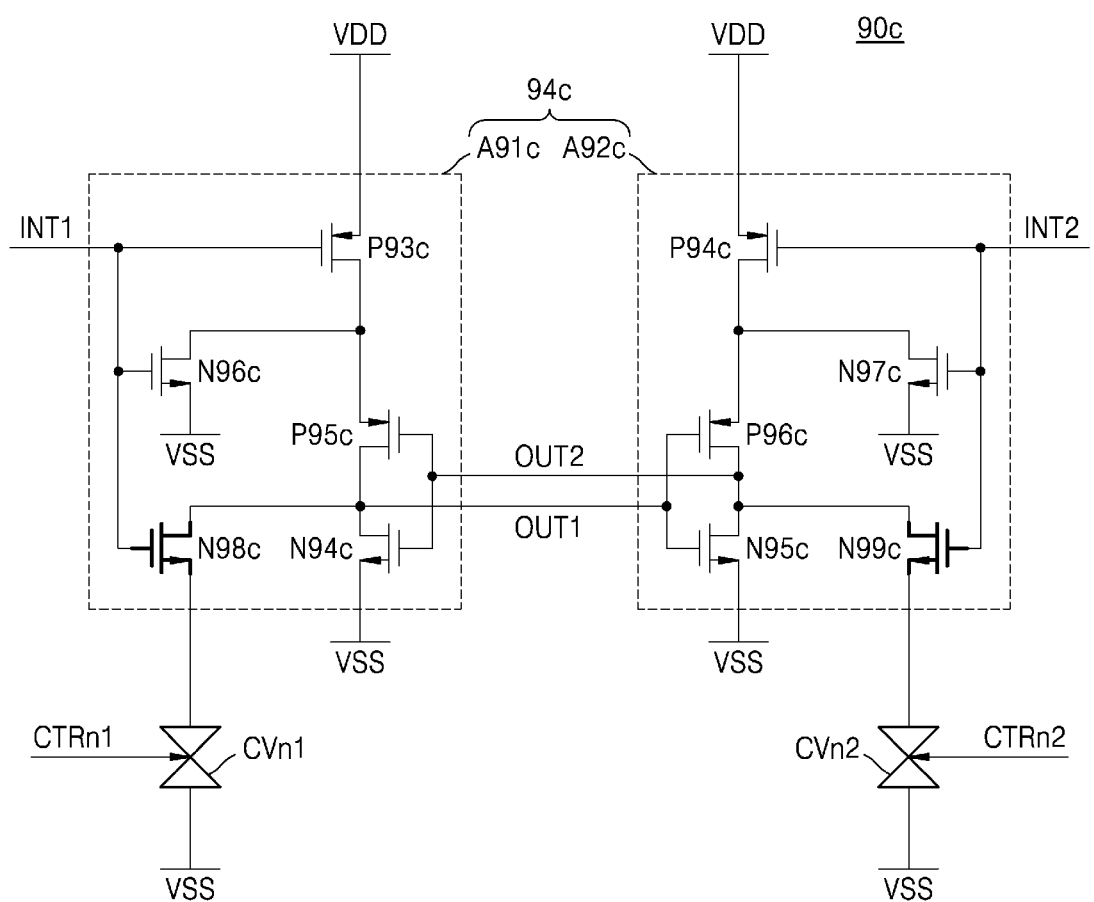

FIGS. 9A, 9B, and 9C are circuit diagrams of examples of comparators according to embodiments. In detail, the circuit diagrams in FIGS. 9A, 9B, and 9C respectively illustrate examples of Miyahara comparators including bottom current valves differently arranged. Each of comparators 90a, 90b, and 90c in FIGS. 9A, 9B, and 9C may include an input circuit having the same structure as the input circuit 82 in FIG. 8, and for convenience of drawing, the input circuit is not shown in FIGS. 9A, 9B, and 9C. In addition, hereinafter, FIGS. 9A, 9B, and 9C will be described with reference to FIG. 8, and the description made with reference to FIG. 8 is not repeated again in a description to be made with reference to FIGS. 9A, 9B, and 9C.

As described above with reference to FIG. 8, the input circuit 82 may receive the clock signal CLK, whereas differential amplification circuits 94a, 94b, and 94c in FIGS. 9A, 9B, and 9C may not receive the clock signal CLK. Accordingly, a bottom current valve may be added to each of nodes mutually corresponding nodes of first and second amplification circuits among nodes connected to the negative supply voltage VSS in the differential amplification circuits 94a, 94b, and 94c.

Referring to FIG. 9A, the comparator 90a may include the differential amplification circuit 94a and the first and second bottom current valves CVn1 and CVn2, and the differential amplification circuit 94a may include first and second amplification circuits A91a and A92a. The first amplification circuit A91a may include a fifth PFET P95a and a fourth NFET N94a which receive the second output signal OUT2 and generate the first output signal OUT1 and may include a third PFET P93a and sixth and eighth NFETs N96a and N98a which receive the first internal signal INT1. In addition, the second amplification circuit A92a may include a sixth PFET P96a and a fifth NFET N95a which receive the first output signal OUT1 and generate the second output signal OUT2 and may include a fourth PFET P94a and seventh and ninth NFETs N97a and N99a which receive the second internal signal INT2. The first bottom current valve CVn1 may be connected to the fourth NFET N94a drawn to be thick, and the second bottom current valve CVn2 may be connected to the fifth NFET N95a drawn to be thick.

Referring to FIG. 9B, the comparator 90b may include the differential amplification circuit 94b and the first and second bottom current valves CVn1 and CVn2, and the differential amplification circuit 94b may include first and second amplification circuits A91b and A92b. The first amplification circuit A91b may include a fifth PFET P95b and a fourth NFET N94b which receive the second output signal OUT2 and generate the first output signal OUT1 and may include a third PFET P93b and sixth and eighth NFETs N96b and N98b which receive the first internal signal INT1. In addition, the second amplification circuit A92b may include a sixth PFET P96b and a fifth NFET N95b which receive the first output signal OUT1 and generate the second output signal OUT2 and may include a fourth PFET P94b and seventh and ninth NFETs N97b and N99b which receive the second internal signal INT2. The first bottom current valve CVn1 may be connected to the sixth NFET N96b drawn to be thick, and the second bottom current valve CVn2 may be connected to the seventh NFET N97b drawn to be thick.

Referring to FIG. 9C, the comparator 90c may include the differential amplification circuit 94c and the first and second bottom current valves CVn1 and CVn2, and the differential amplification circuit 94c may include first and second amplification circuits A91c and A92c. The first amplification circuit A91c may include a fifth PFET P95c and a fourth NFET N94c which receive the second output signal OUT2 and generate the first output signal OUT1 and may include a third PFET P93c and sixth and eighth NFETs N96c and N98c which receive the first internal signal INT1. In addition, the second amplification circuit A92c may include a sixth PFET P96c and a fifth NFET N95c which receive the first output signal OUT1 and generate the second output signal OUT2 and may include a fourth PFET P94c and seventh and ninth NFETs N97c and N99c which receive the second internal signal INT2. The first bottom current valve CVn1 may be connected to the eighth NFET N98c drawn to be thick, and the second bottom current valve CVn2 may be connected to the ninth NFET N99c drawn to be thick.

Figure 10A:
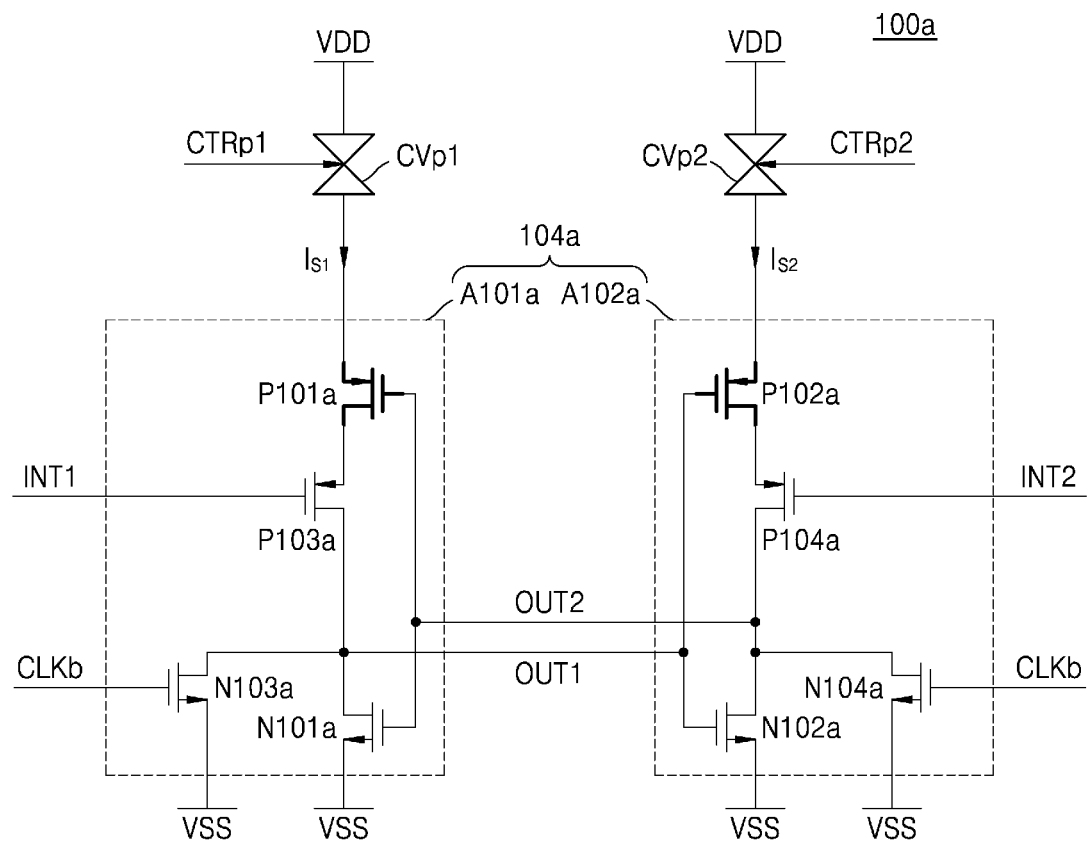
FIGS. 10A and 10B are circuit diagrams of examples of comparators according to embodiments.
Figure 10B:
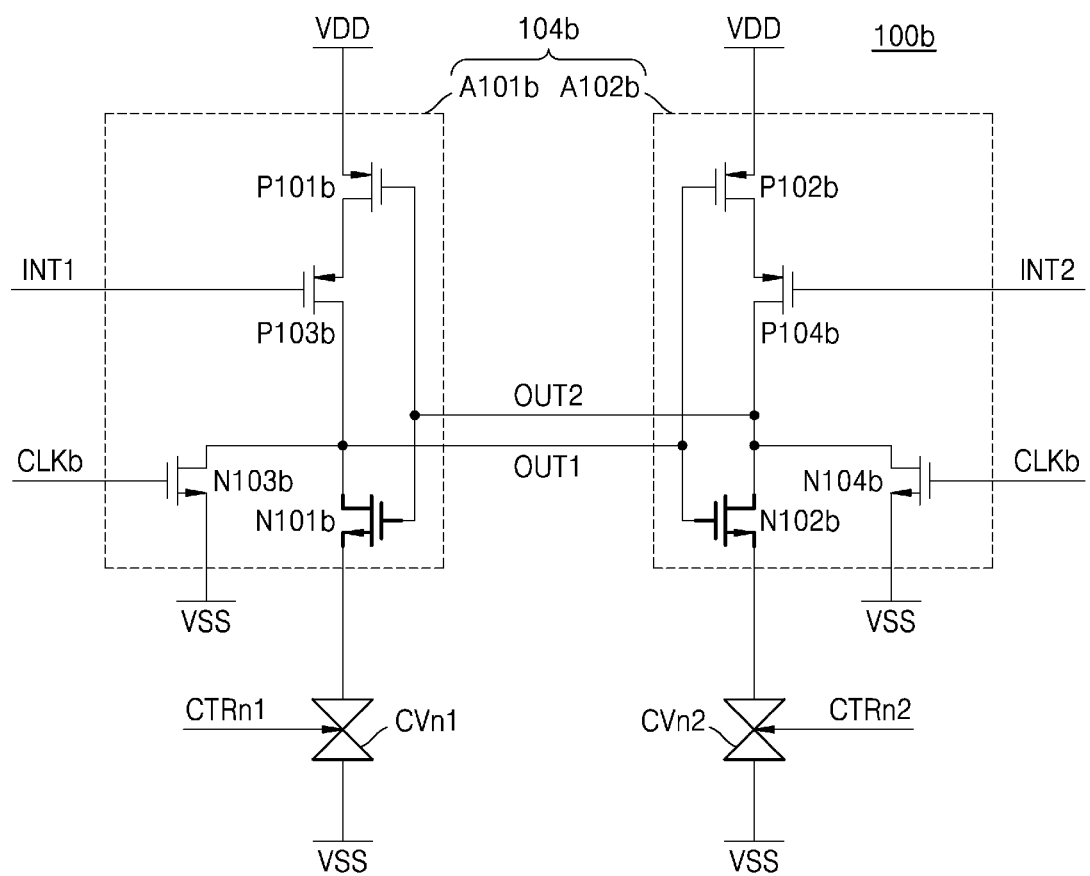

FIGS. 10A and 10B are circuit diagrams of examples of comparators according to embodiments. In detail, the circuit diagrams in FIGS. 10A and 10B illustrate comparators 100a and 100b which include an input circuit and a differential amplification circuit connected in parallel between the positive supply voltage VDD and the negative supply voltage VSS and receives the clock signal CLK, similarly to the comparator 60a in FIG. 6A. Each of the comparators 100a and 100b in FIGS. 10A and 10B may include an input circuit having the same structure as the input circuit 82 in FIG. 8, and for convenience of drawing, the input circuit is not shown in FIGS. 10A and 10B. According to some embodiments, the comparators 100a and 100b in FIGS. 10A and 10B may be referred to as Nauta comparators including a current valve.

Referring to FIG. 10A, the comparator 100a may include a differential amplification circuit 104a and the first and second top current valves CVp1 and CVp2. The differential amplification circuit 104a may include first and second amplification circuits A101a and A102a, and the first and second amplification circuits A101a and A102a may further receive an inverted clock signal CLKb in addition to the first and second internal signals INT1 and INT2. The first amplification circuit A101a may include a first PFET P101a and a first NFET N101a which receive the second output signal OUT2, a third PFET P103a receiving the first internal signal INT1, and a third NFET N103a receiving the inverted clock signal CLKb. In addition, the second amplification circuit A102a may include a second PFET P102a and a second NFET N102a which receive the first output signal OUT1, a fourth PFET P104a receiving the second internal signal INT2, and a fourth NFET N104a receiving the inverted clock signal CLKb. The first top current valve CVp1 may be connected to the first PFET P101a drawn to be thick, and the second top current valve CVp2 may be connected to the second PFET P102a drawn to be thick.

When the clock signal CLK has the low level, for example when the inverted clock signal CLKb has the high level, as described above with reference to FIG. 8, the first and second internal signals INT1 and INT2 may be the same as the positive supply voltage VDD, and nodes at which the first and second output signals OUT1 and OUT2 are generated by the third and fourth NFETs N103a and N104a may be pre-charged to the negative supply voltage VSS. In the rising edge of the clock signal CLK, for example in the falling edge of the inverted clock signal CLKb, the third and fourth NFETs N103a and N104a may be turned off, and accordingly, the first and second output signals OUT1 and OUT2 corresponding to a comparison result of the first and second input signals IN1 and IN2 may be generated Referring to FIG. 10B, the comparator 100b may include a differential amplification circuit 104b and the first and second bottom current valves CVn1 and CVn2. The differential amplification circuit 104b may include first and second amplification circuits A101b and A102b, and the first and second amplification circuits A101b and A102b may further receive the inverted clock signal CLKb in addition to the first and second internal signals INT1 and INT2. The first amplification circuit A101b may include a first PFET P101b and a first NFET N101b which receive the second output signal OUT2, a third PFET P103b receiving the first internal signal INT1, and a third NFET N103b receiving the inverted clock signal CLKb. In addition, the second amplification circuit A102b may include a second PFET P102b and a second NFET N102b which receive the first output signal OUT1, a fourth PFET P104b receiving the second internal signal INT2, and a fourth NFET N104b receiving the inverted clock signal CLKb. The first bottom current valve CVn1 may be connected to the first NFET N101b drawn to be thick, and the second bottom current valve CVn2 may be connected to the second NFET N102b drawn to be thick.

Figure 11:
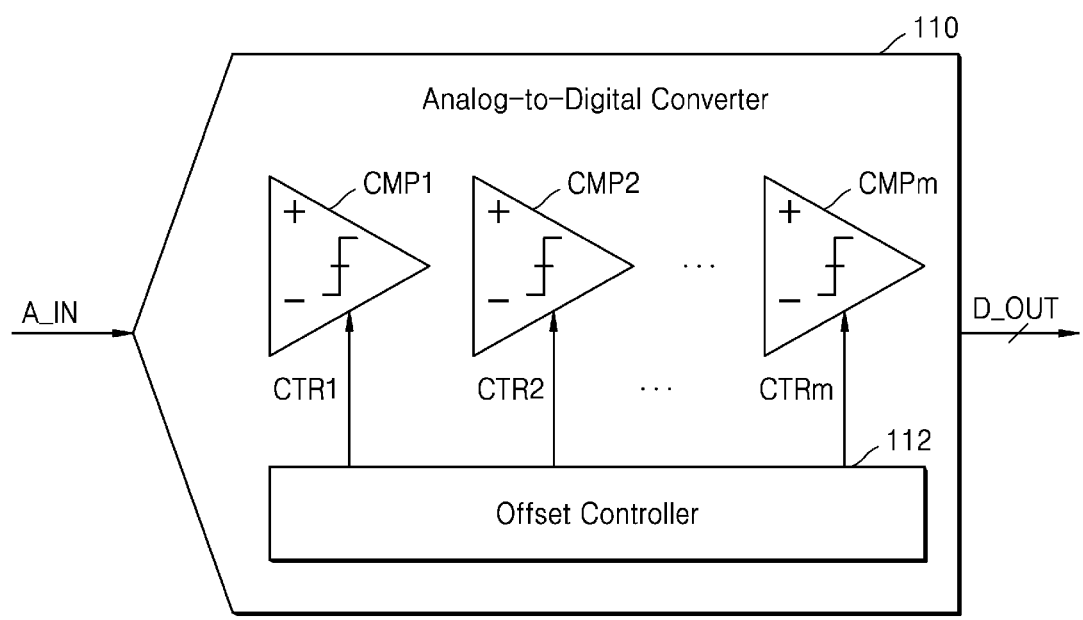
FIG. 11 is a block diagram of an example of an integrated circuit including a comparator, according to an embodiment.

FIG. 11 is a block diagram of an example of an integrated circuit including a comparator, according to an embodiment. In detail, the block diagram in FIG. 11 illustrates an example of an analog-to-digital converter (ADC) 110 as an example of an integrated circuit.

Referring to FIG. 11, the ADC 110 may receive an analog input A_IN and generate a digital output signal D_OUT by converting the analog input A_IN. The ADC 110 may have an arbitrary structure and, as a non-limiting example, have a flash ADC structure, a loop-unrolled successive approximation register (SAR) ADC structure, a time interleaving ADC structure, or the like. As shown in FIG. 11, the ADC 110 may include first to mth comparators CMP1 to CMPm, where m is an integer greater than 1, and an offset controller 112. The first to mth comparators CMP1 to CMPm may mutually compare the analog input A_IN, a reference signal, an analog signal generated based on the analog input A_IN and/or the reference signal, and the like according to a structure of the ADC 110. Each of the first to mth comparators CMP1 to CMPm may include a current valve for offset calibration as described above with reference to the drawings, and accordingly, the performance and efficiency of the ADC 110 may be improved.

The first to mth comparators CMP1 to CMPm may include current valves, respectively, and receive first to mth control signals CTR1 to CTRm for controlling the current valves, respectively. The ADC 110 may be set to a calibration mode or a normal mode, wherein, in the calibration mode, offsets of the first to mth comparators CMP1 to CMPm may be calibrated, and in the normal mode, the digital output signal D_OUT corresponding to the analog input A_IN may be generated.

The offset controller 112 may compensate for the offsets of the first to mth comparators CMP1 to CMPm through the first to mth control signals CTR1 to CTRm in the calibration mode. In addition, the offset controller 112 may maintain the first to mth control signals CTR1 to CTRm corresponding to the compensated offsets in the normal mode. The offset controller 112 may include at least one of logic hardware designed by logic synthesis and a processing unit which includes a processor and software including a series of instructions to be executed by the processor. According to some embodiments, the offset controller 112 may receive a signal, for example MD in FIG. 14A, indicating an operation mode, for example the calibration mode or the normal mode, from outside of the ADC 110. An example of an operation of the offset controller 112 will be described below with reference to FIG. 13.

Figure 12:
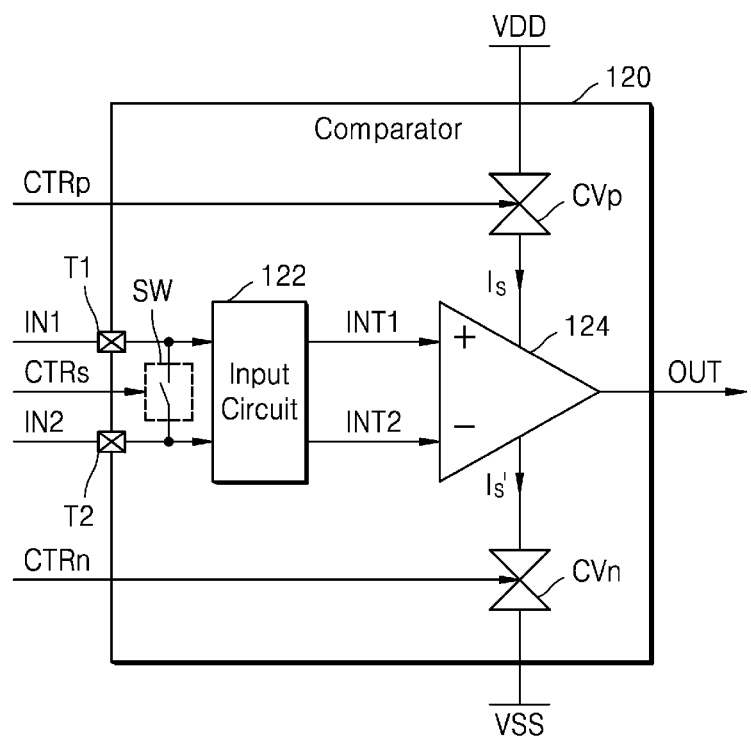
FIG. 12 is a block diagram of an example of a comparator according to an embodiment.

FIG. 12 is a block diagram of an example of a comparator according to an embodiment. A comparator 120 in FIG. 12 may include an input circuit 122, a differential amplification circuit 124, the top current valve CVp, and the bottom current valve CVn similarly to the comparator 10a in FIG. 1A and may further include a switch SW connected between nodes, for example first and second input terminals T1 and T2, to which the first and second input signals IN1 and IN2 are applied. The comparator 120 may receive, as a dynamic comparator, the clock signal CLK like the comparator 60a in FIG. 6A according to some embodiments and may include only one of the top current valve CVp and the bottom current valve CVn according to some embodiments. In addition, although not shown, it will be understood that a switch connected between the nodes to which the first and second input signals IN1 and IN2 are applied may be added to other embodiments, for example the comparator 10b in FIG. 1B.

The switch SW may receive a switch control signal CTRs and electrically connect or disconnect the first and second input terminals T1 and T2 according to the switch control signal CTRs. For example, as described below with reference to FIG. 13, the switch SW may be turned on in the calibration mode to electrically connect the first and second input terminals T1 and T2 and turned off in the normal mode to electrically disconnect the first and second input terminals T1 and T2. When the switch SW is turned on, the comparator 120 may receive the first and second input signals IN1 and IN2 having substantially the same potential, and in an embodiment, the output signal OUT may have an intermediate voltage between the high level and the low level or oscillate between the high level and the low level In an embodiment, when the comparator 120 has an offset, the output signal OUT may have the high level or the low level though the first and second input signals IN1 and IN2 have substantially the same potential. Accordingly, offset calibration may be performed by turning the switch SW on in the calibration mode.

Figure 13:
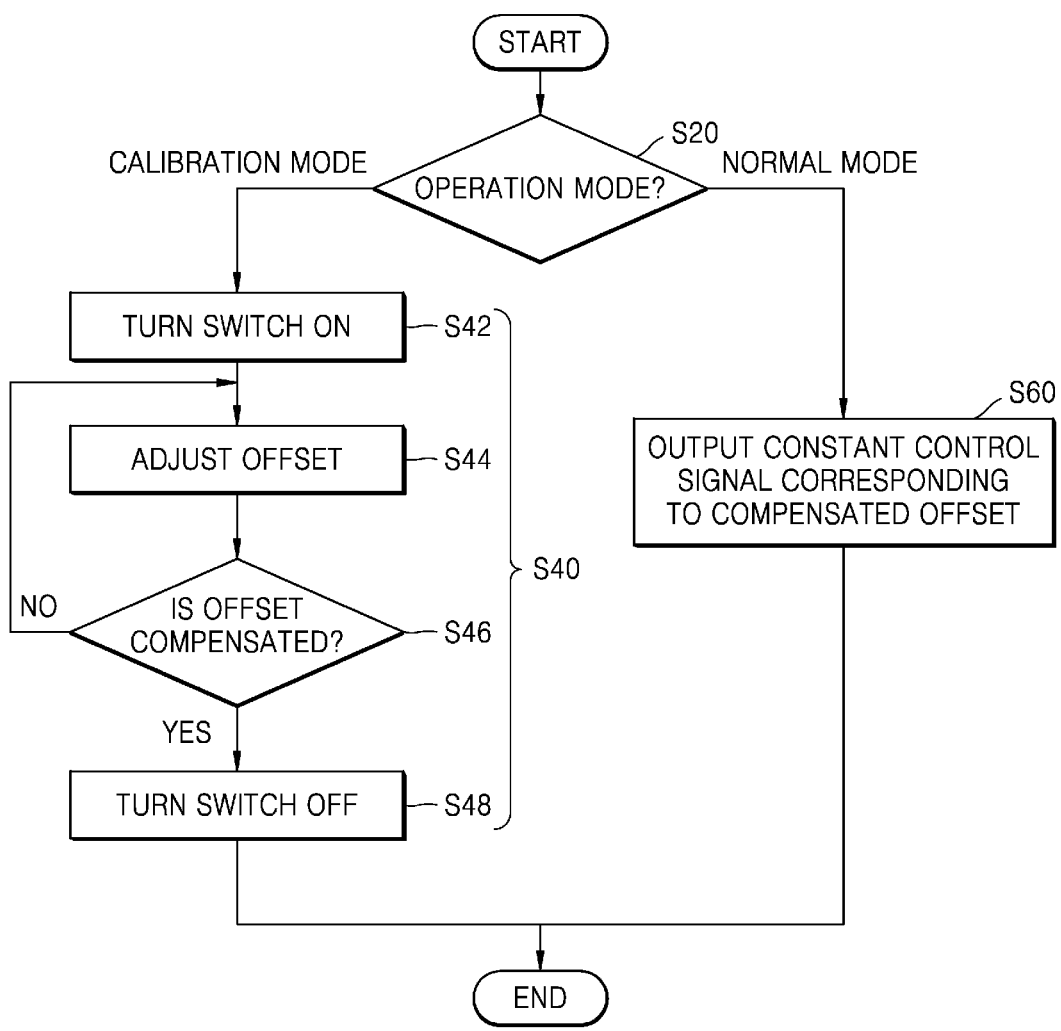
FIG. 13 is a flowchart of an example of a method of calibrating an offset of a comparator, according to an embodiment.

FIG. 13 is a flowchart of an example of a method of calibrating an offset of a comparator, according to an embodiment. In detail, the flowchart in FIG. 13 illustrates a method of calibrating an offset of a comparator including the switch SW connected between the first and second input terminals T1 and T2, like the comparator 120 in FIG. 12. According to some embodiments, the method of FIG. 13 may be performed by the offset controller 112 in FIG. 12, and in the description of FIG. 13 hereinafter, it is assumed that the offset controller 112 controls the comparator 120 in FIG. 12, and FIGS. 11 and 12 will be referred to.

Referring to FIG. 13, in operation S20, an operation mode may be determined. According to some embodiments, the offset controller 112 may receive a signal indicating the operation mode from outside of the ADC 110. According to some embodiments, the offset controller 112 may determine the calibration mode when power is supplied to the ADC 110 and determine the normal mode when the calibration mode is finished. As shown in FIG. 13, operation S40 may be performed in the calibration mode, and operation S60 may be performed in the normal mode.

As shown in FIG. 13, operation S40 performed in the calibration mode may include operations S42, S44, S46, and S48. In operation S42, the switch SW may be turned on. For example, the offset controller 112 may provide the switch control signal CTRs for turning on the switch SW to the comparator 120, and accordingly, the first and second input terminals T1 and T2 may be electrically connected.

In operation S44, an offset may be adjusted. For example, the offset controller 112 may adjust the offset of the comparator 120 by changing at least one of the top control signal CTRp and the bottom control signal CTRn. As described above with reference to the drawings, the comparator 120 may provide a wide offset adjustment range and a high offset adjustment resolution without influencing the other characteristics of the comparator 120.

In operation S46, it is determined whether the offset is compensated. For example, the output signal OUT of the comparator 120 may be fed back to the offset controller 112, and the offset controller 112 may determine that offset compensation is finished when the output signal OUT oscillates with about 50% duty between the high level and the low level or when the output signal OUT has an intermediate level between the high level and the low level. As shown in FIG. 13, when the offset compensation is finished, operation S48 may be subsequently performed, otherwise, operations S44 and S46 may be repetitively performed.

In operation S48, the switch may be turned off. For example, because the offset has been compensated in operation S46, the offset controller 112 may output the switch control signal CTRs for turning off the switch SW such that the comparator 120 compares the first and second input signals IN1 and IN2 in the normal mode, and accordingly, the first and second input terminals T1 and T2 may be electrically disconnected.

In the normal mode, operation S60 may be performed, and in operation S60, a constant control signal corresponding to the compensated offset may be output. For example, the offset controller 112 may generate the top control signal CTRp and the bottom control signal CTRn corresponding to the offset compensated in the calibration mode. Accordingly, the comparator 120 may generate the output signal OUT by comparing the first and second input signals IN1 and IN2 in a state in which the offset has been compensated.

Figure 14A:
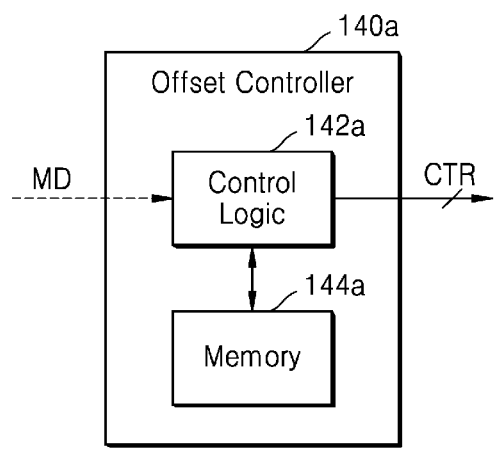
FIGS. 14A and 14B are block diagrams of examples of offset controllers according to embodiments.
Figure 14B:
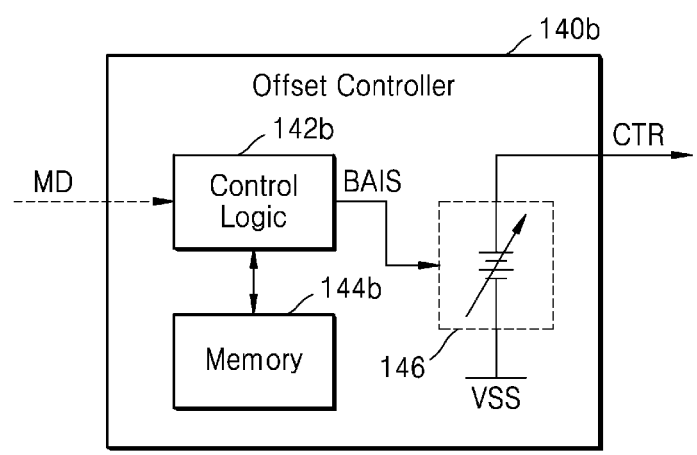

FIGS. 14A and 14B are block diagrams of examples of offset controllers according to embodiments. As described above with reference to FIG. 12, offset controllers 140a and 140*b* in FIGS. 14A and 14B may generate a control signal CTR for adjusting an offset of a comparator. Hereinafter, a duplicated description with respect to FIGS. 14A and 14B will be omitted.

Referring to FIG. 14A, the offset controller 140*a* may generate the control signal CTR as a multi-bit signal, and may include a control logic 142*a* and a memory 144*a*. According to some embodiments, the control logic 142*a* may receive a mode signal MD as shown as a dashed line in FIG. 14A and determine the calibration mode or the normal mode based on the mode signal MD. According to some embodiments, the control logic 142*a* may enter the calibration mode when power is supplied to the offset controller 140*a*, and enter the normal mode by releasing the calibration mode when offset compensation is finished in the calibration mode. A current valve may include a first transistor receiving a bit of the control signal CTR, and a supply current provided to a comparator may be adjusted by the first transistor turned on or off according to the bit of the control signal CTR. According to some embodiments, the control logic 142*a* may further output the switch control signal CTRs for controlling the switch SW in FIG. 12.

The control logic 142*a* may store, in the memory 144*a*, a compensated offset or a value of the control signal CTR corresponding to the compensated offset in the calibration mode and output the constant control signal CTR according to the value stored in the memory 144*a* in the normal mode. The memory 144*a* may include, as a non-limiting example, a volatile memory such as a latch, a flipflop, static random access memory (SRAM), or dynamic random access memory (DRAM) and include, as a non-limiting example, a non-volatile memory such as a flash memory or electrically erasable programmable read only memory (EEPROM).

Referring to FIG. 14B, the offset controller 140*b* may generate at least one control signal CTR as an analog signal and include a control logic 142*b*, a memory 144*b*, and a variable voltage source 146. The control logic 142*b* may provide a bias control signal BIAS to the variable voltage source 146 in the calibration mode, and the variable voltage source 146 may output the at least one control signal CTR having a magnitude, for example voltage, corresponding to the bias control signal BIAS. A current valve may include a first transistor receiving the at least one control signal CTR, and a supply current provided to a comparator may be adjusted by the first transistor adjusting a current flowing therethrough according to a magnitude of the at least one control signal CTR. According to some embodiments, the bias control signal BIAS may be a digital signal, and the variable voltage source 146 may include a digital-to-analog converter (DAC).

Figure 15:
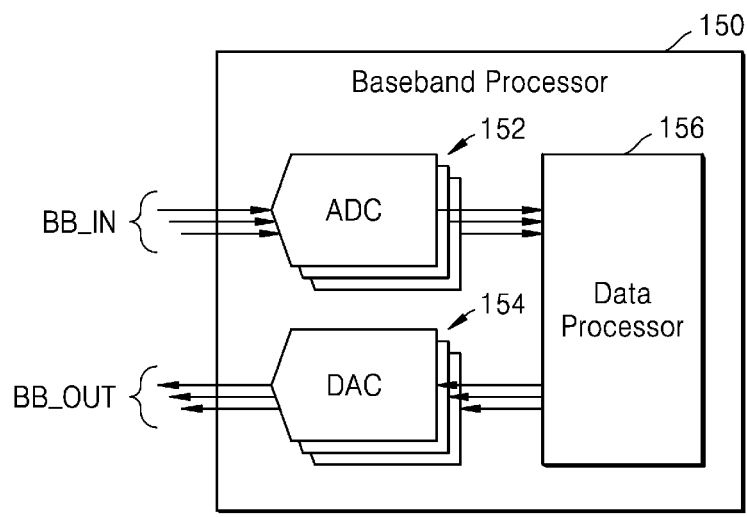
FIG. 15 is a block diagram of an example of a baseband processor according to an embodiment.

FIG. 15 is a block diagram of an example of a baseband processor according to an embodiment. The baseband processor may be included in a communication device for wireless communication and may be referred to as a modem, a communication processor, or the like. As shown in FIG. 15, a baseband processor 150 may include a plurality of ADCs 152, a plurality of DACs 154, and a data processor 156.

The baseband processor 150 may receive a baseband input signal BB_IN as an analog signal and generate a baseband output signal BB_OUT as an analog signal. For example, the baseband processor 150 may receive the baseband input signal BB_IN from a radio frequency integrated circuit (RFIC) or a transceiver, and may provide the baseband output signal BB_OUT to the RFIC or transceiver. As shown in FIG. 15, the baseband input signal BB_IN may be received via a plurality of paths, and accordingly, the baseband processor 150 may include the plurality of ADCs 152 to process the baseband input signal BB_IN. Likewise, the baseband output signal BB_OUT may be output via a plurality of paths, and accordingly, the baseband processor 150 may include the plurality of DACs 154 to generate the baseband output signal BB_OUT. Each of the plurality of ADCs 152 may include a plurality of comparators, and each of the plurality of comparators may include a current valve for offset calibration according to an embodiment. Accordingly, the performance and efficiency of the plurality of ADCs 152 may be improved, and as a result, the usefulness of the baseband processor 150 may increase.

The data processor 156 may extract information received through wireless communication by processing digital signals provided from the plurality of ADCs 152. For example, the data processor 156 may perform demodulation, decoding, and the like. In addition, the data processor 156 may provide, to the plurality of DACs 154, a digital signal including information to be transmitted through wireless communication. For example, the data processor 156 may generate the digital signal provided to the plurality of DACs 154, by performing modulation, encoding, and the like.

While embodiments been particularly shown and described, it will be understood that various changes in form and details may be made therein without departing from the spirit and scope of the following claims.

What is claimed is:

1. A comparator configured to calibrate an offset according to a control signal, the comparator comprising:
   a differential amplification circuit configured to consume a supply current; and
   a current valve configured to adjust at least a portion of the supply current based on the control signal,
   wherein the current valve comprises a plurality of first transistors comprising at least one dynamically controlled transistor configured to receive the control signal, and
   wherein the differential amplification circuit comprises a plurality of second transistors having commonly connected control electrodes, and
   wherein each of the plurality of second transistors are connected to at least one first transistor of the plurality of first transistors.

2. The comparator of claim 1,
   wherein the plurality of first transistors are connected between the differential amplification circuit and one of a positive voltage node and a negative voltage node.

3. The comparator of claim 1, wherein the plurality of first transistors comprises at least one statically controlled transistor having a control electrode configured to receive a positive supply voltage or a negative supply voltage.

4. The comparator of claim 3, wherein the at least one dynamically controlled transistor and the at least one statically controlled transistor are connected to one second transistor among the plurality of second transistors.

5. The comparator of claim 1, wherein the at least one dynamically controlled transistor is configured to be turned on or turned off according to the control signal.

6. The comparator of claim 1,
   wherein the differential amplification circuit comprises a first amplification circuit cross-coupled with a second amplification circuit,
   wherein the first amplification circuit is configured to generate a first output signal,
   wherein the second amplification circuit is configured to generate a second output signal complementary to the first output signal, and wherein the current valve comprises:
a first current valve configured to adjust a first supply current flowing through the first amplification circuit; and
a second current valve configured to adjust a second supply current flowing through the second amplification circuit.

7. A comparator configured to calibrate an offset according to a control signal, the comparator comprising:
a differential amplification circuit configured to consume a supply current; and
a current valve configured to adjust at least a portion of the supply current based on the control signal and comprising a plurality of first p-channel field-effect transistors (PFETs) having sources connected to a positive voltage node,
wherein the plurality of first PFETs comprises at least one first PFET having a gate configured to receive the control signal, and
wherein the differential amplification circuit comprises a plurality of second PFETs having commonly connected gates and commonly connected drains.

8. The comparator of claim 7, wherein each second PFET of the plurality of second PFETS has a source connected to a drain of at least one first PFET of the plurality of first PFETs.

9. The comparator of claim 8,
wherein the drain of the at least one first PFET is connected to at least one second PFET of the plurality of second PFETs, and
wherein a first current driving capability of the at least one first PFET is greater than or equal to a second current driving capability of the at least one second PFET.

10. The comparator of claim 8,
wherein the plurality of second PFETs includes at least two second PFETs having different current driving capabilities, and
wherein each first PFET of the plurality of first PFETs has a first current driving capability proportional to a second current driving capability of a second PFET connected to a drain of the each first PFET from among the plurality of second PFETs.

11. The comparator of claim 8, wherein each of the plurality of first PFETs and the plurality of second PFETs comprises at least one unit PFET connected in parallel.

12. The comparator of claim 8, wherein the plurality of first PFETs comprises a first PFET having a gate configured to receive a negative supply voltage.

13. The comparator of claim 8, wherein the at least one first PFET is configured to be turned on or turned off according to the control signal.

14. A comparator configured to calibrate an offset according to a control signal, the comparator comprising:
a differential amplification circuit configured to consume a supply current; and
a current valve configured to adjust at least a portion of the supply current based on the control signal, and comprising a plurality of first n-channel field-effect transistors (NFETs) having sources connected to a negative voltage node,
wherein the plurality of first NFETs comprises at least one first NFET having a gate configured to receive the control signal, and
wherein the differential amplification circuit comprises a plurality of second NFETs having commonly connected gates and commonly connected drains.

15. The comparator of claim 14, wherein each second NFET of the plurality of second NFETs has a source connected to a drain of at least one first NFET of the plurality of first NFETs.

16. The comparator of claim 15, wherein the drain of the at least one first NFET is connected to at least one second NFET of the plurality of second NFETs, and
wherein a first current driving capability of the at least one first NFET is greater than or equal to a second current driving capability of the at least one second NFET.

17. The comparator of claim 15,
wherein the plurality of second NFETs includes at least two second NFETs having different current driving capabilities, and
wherein each first NFET of the plurality of first NFETs has a first current driving capability proportional to a second current driving capability of a second NFET connected to a drain of the each first NFET from among the plurality of second NFETs.

18. The comparator of claim 15, wherein each of the plurality of first NFETs and the plurality of second NFETs comprises at least one unit NFET connected in parallel.

19. The comparator of claim 15, wherein the plurality of first NFETs comprises a first NFET having a gate configured to receive a positive supply voltage.

20. The comparator of claim 15, wherein the at least one first NFET is configured to be turned on or turned off according to the control signal.

* * * * *